(12) United States Patent
Weinberg et al.

(10) Patent No.: US 11,860,714 B1
(45) Date of Patent: Jan. 2, 2024

(54) ERROR NOTIFICATION USING AN EXTERNAL CHANNEL

(71) Applicant: Micron Technology, Inc., Boise, ID (US)

(72) Inventors: Yoav Weinberg, Toronto (CA); Chandrakanth Rapalli, Hyderabad (IN); Tal Sharifie, Lehavim (IL)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 18/048,286

(22) Filed: Oct. 20, 2022

(51) Int. Cl.
  *G06F 11/00* (2006.01)
  *G06F 11/07* (2006.01)
  *G06F 11/10* (2006.01)

(52) U.S. Cl.
  CPC ...... *G06F 11/0766* (2013.01); *G06F 11/1096* (2013.01)

(58) Field of Classification Search
  CPC .................................. G06F 11/07; G06F 11/10
  USPC ...................................................... 714/1–57
  See application file for complete search history.

(56) References Cited

U.S. PATENT DOCUMENTS

| | | | | |
|---|---|---|---|---|
| 7,043,679 B1 * | 5/2006 | Keltcher | ............... | G06F 11/106 714/763 |
| 2009/0157950 A1 * | 6/2009 | Selinger | .................. | G06F 12/08 711/E12.008 |
| 2011/0208995 A1 * | 8/2011 | Hafner | ................ | G06F 11/1474 711/155 |
| 2014/0129871 A1 * | 5/2014 | Poenaru | .............. | G06F 11/1004 714/2 |
| 2019/0361777 A1 * | 11/2019 | Pawlowski | ....... | H03M 13/6516 |
| 2022/0291994 A1 * | 9/2022 | Matsuura | ............ | G06F 11/1068 |
| 2022/0350699 A1 * | 11/2022 | Langadi | .............. | G06F 11/1048 |
| 2023/0007903 A1 * | 1/2023 | Park | ....................... | G06F 3/0604 |

\* cited by examiner

*Primary Examiner* — Sarai E Butler
(74) *Attorney, Agent, or Firm* — Holland & Hart LLP

(57) ABSTRACT

Methods, systems, and devices for error notification using an external channel are described. In some cases, a memory system having a host-driven logical block interface may issue a notification of a detected error using an out of band channel. For example, after receiving a data unit from a host system but prior to storing the data in a memory array of the memory system, the memory system may transmit an acknowledgment to host system to indicate that the data was successfully received. As part of storing the data, the memory system may transfer the data along data paths between various components and perform parity checks at each component. If the memory system detects an error along a data path, the memory system may issue a notification of the error to the host system over the out of band channel.

25 Claims, 8 Drawing Sheets

ERROR NOTIFICATION USING AN EXTERNAL CHANNEL

FIELD OF TECHNOLOGY

The following relates to one or more systems for memory, including error notification using an external channel.

BACKGROUND

Memory devices are widely used to store information in various electronic devices such as computers, user devices, wireless communication devices, cameras, digital displays, and the like. Information is stored by programming memory cells within a memory device to various states. For example, binary memory cells may be programmed to one of two supported states, often corresponding to a logic 1 or a logic 0. In some examples, a single memory cell may support more than two possible states, any one of which may be stored by the memory cell. To access information stored by a memory device, a component may read (e.g., sense, detect, retrieve, identify, determine, evaluate) the state of one or more memory cells within the memory device. To store information, a component may write (e.g., program, set, assign) one or more memory cells within the memory device to corresponding states.

Various types of memory devices exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), 3-dimensional cross-point memory (3D cross point), not-or (NOR) and not-and (NAND) memory devices, and others. Memory devices may be described in terms of volatile configurations or non-volatile configurations. Volatile memory cells (e.g., DRAM) may lose their programmed states over time unless they are periodically refreshed by an external power source. Non-volatile memory cells (e.g., NAND) may maintain their programmed states for extended periods of time even in the absence of an external power source.

DETAILED DESCRIPTION

Some memory systems may include circuitry configured to detect errors associated with various operations or various components of the memory system. Such memory systems may be incorporated in environments such as vehicle safety systems, autonomous vehicle systems, or other safety-critical systems that may have strict requirements. For example, a memory system may include error detection capabilities for data communicated between the memory system and a host device. In some cases, if the memory system detects an error in the data as part of storing the data (e.g., after successfully receiving the data from the host system), the memory system may corrupt error control codes included with the data to indicate to the host system that an error was detected. Accordingly, upon receiving the data (e.g., as part of a read operation for the data), the host system may determine that the data is corrupt. However, such a scheme may delay notification of an error until the host system requests to read the data, which may remove the ability of the host system to repair the data or take other action in a timely manner. Accordingly, techniques to improve error notification in a memory system using a host-driven interface are desired.

As described herein, a memory system having a host-driven logical block interface may issue a notification of a detected error using an out of band channel (e.g., a channel external to the host-driven logical block interface). For example, after receiving a data unit from a host system but prior to storing the data in a memory array of the memory system, the memory system may transmit an acknowledgment to the host system to indicate that the data was successfully received. As part of storing the data, the memory system may transfer the data along data paths between various components, such as a data storage controller, a buffer, and an encoder/decoder, and perform parity checks at one or more of the components. If the memory system detects an error along a data path, the memory system may issue a notification of the error to the host system using the out of band channel. Additionally or alternatively, the memory system may check for errors in the data as part of maintenance operations, such as garbage collection. If the memory system detects an error during a maintenance operation, the memory system may transmit an indication of the error over the out of band channel. In some cases, the memory system may store information about the error in a host system accessible register, and the host system may read the register to determine additional information about the error.

Figure 1:
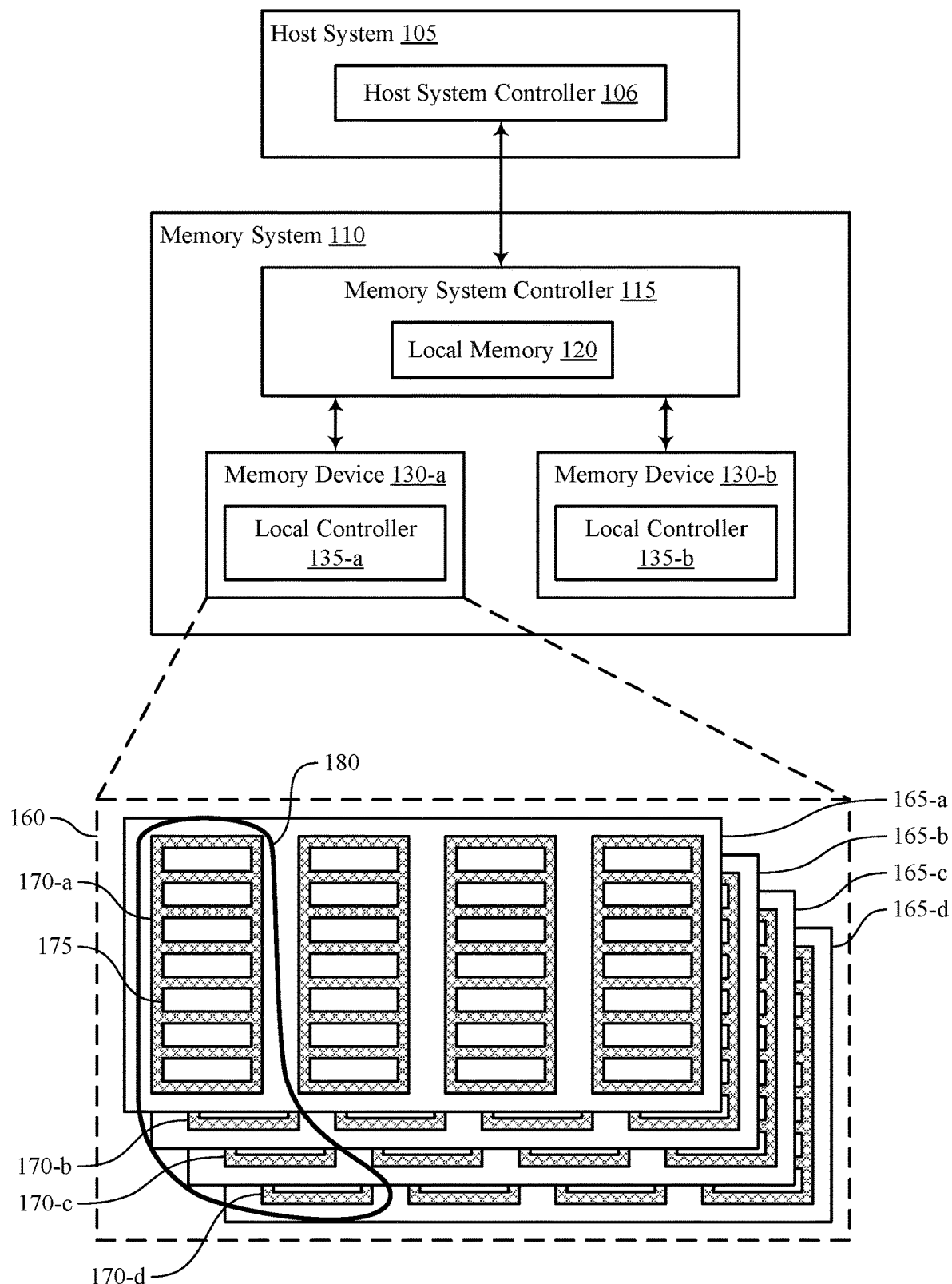
FIG. 1 illustrates an example of a system that supports error notification using an external channel in accordance with examples as disclosed herein.
Figure 2:
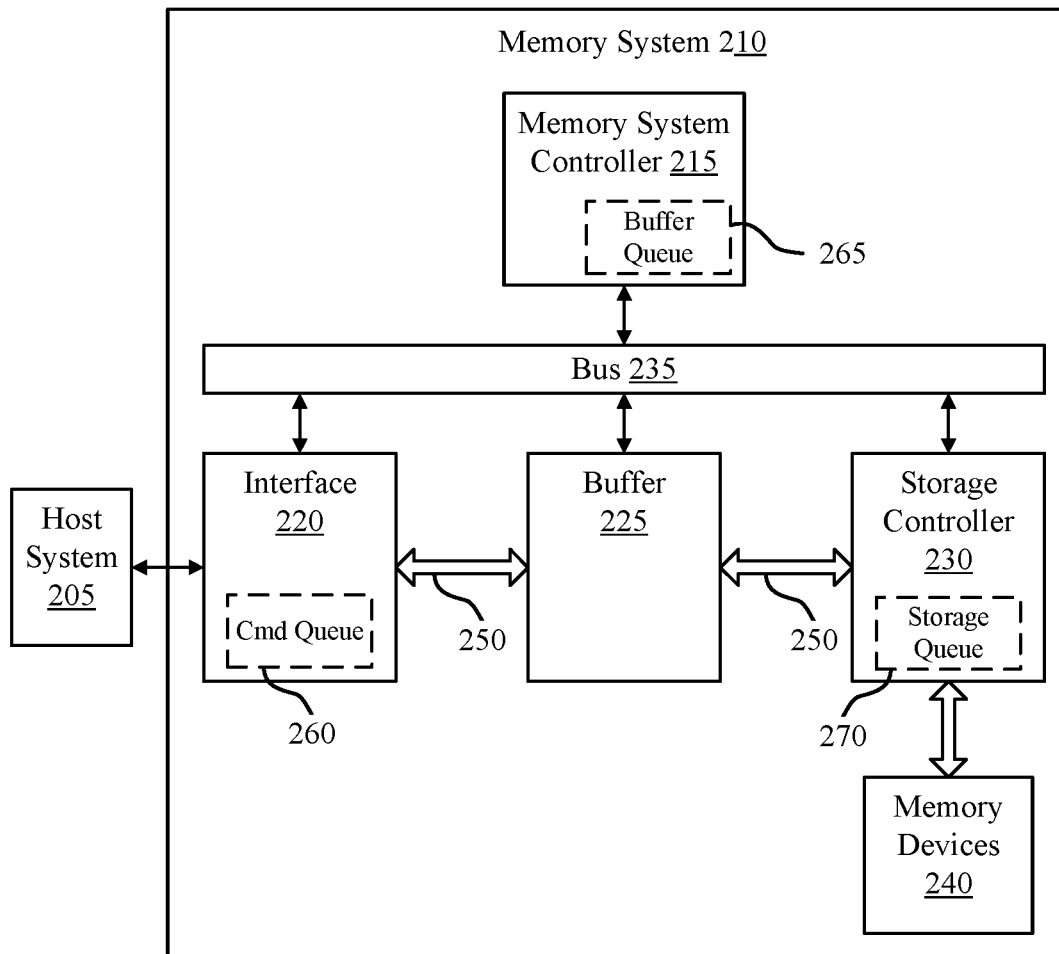
FIG. 2 illustrates an example of a system that supports error notification using an external channel in accordance with examples as disclosed herein.

Features of the disclosure are initially described in the context of systems, devices, and circuits with reference to FIGS. 1 through 2. Features of the disclosure are described in the context of a system and process flows with reference to FIGS. 3 through 5. These and other features of the disclosure are further illustrated by and described in the context of an apparatus diagram and flowchart that relate to error notification using an external channel with reference to FIGS. 6 through 7.

FIG. 1 illustrates an example of a system 100 that supports error notification using an external channel in accordance with examples as disclosed herein. The system 100 includes a host system 105 coupled with a memory system 110.

A memory system 110 may be or include any device or collection of devices, where the device or collection of devices includes at least one memory array. For example, a memory system 110 may be or include a Universal Flash Storage (UFS) device, an embedded Multi-Media Controller (eMMC) device, a flash device, a universal serial bus (USB) flash device, a secure digital (SD) card, a solid-state drive (SSD), a hard disk drive (HDD), a dual in-line memory module (DIMM), a small outline DIMM (SO-DIMM), or a non-volatile DIMM (NVDIMM), among other possibilities.

The system 100 may be included in a computing device such as a desktop computer, a laptop computer, a network server, a mobile device, a vehicle (e.g., airplane, drone, train, automobile, or other conveyance), an Internet of Things (IoT) enabled device, an embedded computer (e.g., one included in a vehicle, industrial equipment, or a networked commercial device), or any other computing device that includes memory and a processing device.

The system 100 may include a host system 105, which may be coupled with the memory system 110. In some examples, this coupling may include an interface with a host system controller 106, which may be an example of a controller or control component configured to cause the host system 105 to perform various operations in accordance with examples as described herein. The host system 105 may include one or more devices and, in some cases, may include a processor chipset and a software stack executed by the processor chipset. For example, the host system 105 may include an application configured for communicating with the memory system 110 or a device therein. The processor chipset may include one or more cores, one or more caches (e.g., memory local to or included in the host system 105), a memory controller (e.g., NVDIMM controller), and a storage protocol controller (e.g., peripheral component interconnect express (PCIe) controller, serial advanced technology attachment (SATA) controller). The host system 105 may use the memory system 110, for example, to write data to the memory system 110 and read data from the memory system 110. Although one memory system 110 is shown in FIG. 1, the host system 105 may be coupled with any quantity of memory systems 110.

The host system 105 may be coupled with the memory system 110 via at least one physical host interface. The host system 105 and the memory system 110 may, in some cases, be configured to communicate via a physical host interface using an associated protocol (e.g., to exchange or otherwise communicate control, address, data, and other signals between the memory system 110 and the host system 105). Examples of a physical host interface may include, but are not limited to, a SATA interface, a UFS interface, an eMMC interface, a PCIe interface, a USB interface, a Fiber Channel interface, a Small Computer System Interface (SCSI), a Serial Attached SCSI (SAS), a Double Data Rate (DDR) interface, a DIMM interface (e.g., DIMM socket interface that supports DDR), an Open NAND Flash Interface (ONFI), and a Low Power Double Data Rate (LPDDR) interface. In some examples, one or more such interfaces may be included in or otherwise supported between a host system controller 106 of the host system 105 and a memory system controller 115 of the memory system 110. In some examples, the host system 105 may be coupled with the memory system 110 (e.g., the host system controller 106 may be coupled with the memory system controller 115) via a respective physical host interface for each memory device 130 included in the memory system 110, or via a respective physical host interface for each type of memory device 130 included in the memory system 110.

The memory system 110 may include a memory system controller 115 and one or more memory devices 130. A memory device 130 may include one or more memory arrays of any type of memory cells (e.g., non-volatile memory cells, volatile memory cells, or any combination thereof). Although two memory devices 130-$a$ and 130-$b$ are shown in the example of FIG. 1, the memory system 110 may include any quantity of memory devices 130. Further, if the memory system 110 includes more than one memory device 130, different memory devices 130 within the memory system 110 may include the same or different types of memory cells.

The memory system controller 115 may be coupled with and communicate with the host system 105 (e.g., via the physical host interface) and may be an example of a controller or control component configured to cause the memory system 110 to perform various operations in accordance with examples as described herein. The memory system controller 115 may also be coupled with and communicate with memory devices 130 to perform operations such as reading data, writing data, erasing data, or refreshing data at a memory device 130—among other such operations—which may generically be referred to as access operations. In some cases, the memory system controller 115 may receive commands from the host system 105 and communicate with one or more memory devices 130 to execute such commands (e.g., at memory arrays within the one or more memory devices 130). For example, the memory system controller 115 may receive commands or operations from the host system 105 and may convert the commands or operations into instructions or appropriate commands to achieve the desired access of the memory devices 130. In some cases, the memory system controller 115 may exchange data with the host system 105 and with one or more memory devices 130 (e.g., in response to or otherwise in association with commands from the host system 105). For example, the memory system controller 115 may convert responses (e.g., data packets or other signals) associated with the memory devices 130 into corresponding signals for the host system 105.

The memory system controller 115 may be configured for other operations associated with the memory devices 130. For example, the memory system controller 115 may execute or manage operations such as wear-leveling operations, garbage collection operations, error control operations such as error-detecting operations or error-correcting operations, encryption operations, caching operations, media management operations, background refresh, health monitoring, and address translations between logical addresses (e.g., logical block addresses (LBAs)) associated with commands from the host system 105 and physical addresses (e.g., physical block addresses) associated with memory cells within the memory devices 130.

The memory system controller 115 may include hardware such as one or more integrated circuits or discrete components, a buffer memory, or a combination thereof. The hardware may include circuitry with dedicated (e.g., hard-coded) logic to perform the operations ascribed herein to the memory system controller 115. The memory system controller 115 may be or include a microcontroller, special purpose logic circuitry (e.g., a field programmable gate array (FPGA), an application specific integrated circuit (ASIC), a digital signal processor (DSP)), or any other suitable processor or processing circuitry.

The memory system controller 115 may also include a local memory 120. In some cases, the local memory 120 may include read-only memory (ROM) or other memory that may store operating code (e.g., executable instructions) executable by the memory system controller 115 to perform functions ascribed herein to the memory system controller 115. In some cases, the local memory 120 may additionally or alternatively include static random access memory (SRAM) or other memory that may be used by the memory system controller 115 for internal storage or calculations, for example, related to the functions ascribed herein to the memory system controller 115. Additionally or alternatively, the local memory 120 may serve as a cache for the memory system controller 115. For example, data may be stored in the local memory 120 if read from or written to a memory device 130, and the data may be available within the local memory 120 for subsequent retrieval for or manipulation (e.g., updating) by the host system 105 (e.g., with reduced latency relative to a memory device 130) in accordance with a cache policy.

Although the example of the memory system 110 in FIG. 1 has been illustrated as including the memory system controller 115, in some cases, a memory system 110 may not include a memory system controller 115. For example, the memory system 110 may additionally or alternatively rely upon an external controller (e.g., implemented by the host system 105) or one or more local controllers 135, which may be internal to memory devices 130, respectively, to perform the functions ascribed herein to the memory system controller 115. In general, one or more functions ascribed herein to the memory system controller 115 may, in some cases, be performed instead by the host system 105, a local controller 135, or any combination thereof. In some cases, a memory device 130 that is managed at least in part by a memory system controller 115 may be referred to as a managed memory device. An example of a managed memory device is a managed NAND (MNAND) device.

A memory device 130 may include one or more arrays of non-volatile memory cells. For example, a memory device 130 may include NAND (e.g., NAND flash) memory, ROM, phase change memory (PCM), self-selecting memory, other chalcogenide-based memories, ferroelectric random access memory (RAM) (FeRAM), magneto RAM (MRAM), NOR (e.g., NOR flash) memory, Spin Transfer Torque (STT)-MRAM, conductive bridging RAM (CBRAM), resistive random access memory (RRAM), oxide based RRAM (OxRAM), electrically erasable programmable ROM (EEPROM), or any combination thereof. Additionally or alternatively, a memory device 130 may include one or more arrays of volatile memory cells. For example, a memory device 130 may include RAM memory cells, such as dynamic RAM (DRAM) memory cells and synchronous DRAM (SDRAM) memory cells.

In some examples, a memory device 130 may include (e.g., on a same die or within a same package) a local controller 135, which may execute operations on one or more memory cells of the respective memory device 130. A local controller 135 may operate in conjunction with a memory system controller 115 or may perform one or more functions ascribed herein to the memory system controller 115. For example, as illustrated in FIG. 1, a memory device 130-a may include a local controller 135-a and a memory device 130-b may include a local controller 135-b.

In some cases, a memory device 130 may be or include a NAND device (e.g., NAND flash device). A memory device 130 may be or include a memory die 160. For example, in some cases, a memory device 130 may be a package that includes one or more dies 160. A die 160 may, in some examples, be a piece of electronics-grade semiconductor cut from a wafer (e.g., a silicon die cut from a silicon wafer). Each die 160 may include one or more planes 165, and each plane 165 may include a respective set of blocks 170, where each block 170 may include a respective set of pages 175, and each page 175 may include a set of memory cells.

In some cases, a NAND memory device 130 may include memory cells configured to each store one bit of information, which may be referred to as single level cells (SLCs). Additionally or alternatively, a NAND memory device 130 may include memory cells configured to each store multiple bits of information, which may be referred to as multi-level cells (MLCs) if configured to each store two bits of information, as tri-level cells (TLCs) if configured to each store three bits of information, as quad-level cells (QLCs) if configured to each store four bits of information, or more generically as multiple-level memory cells. Multiple-level memory cells may provide greater density of storage relative to SLC memory cells but may, in some cases, involve narrower read or write margins or greater complexities for supporting circuitry.

In some cases, planes 165 may refer to groups of blocks 170, and in some cases, concurrent operations may take place within different planes 165. For example, concurrent operations may be performed on memory cells within different blocks 170 so long as the different blocks 170 are in different planes 165. In some cases, an individual block 170 may be referred to as a physical block, and a virtual block 180 may refer to a group of blocks 170 within which concurrent operations may occur. For example, concurrent operations may be performed on blocks 170-a, 170-b, 170-c, and 170-d that are within planes 165-a, 165-b, 165-c, and 165-d, respectively, and blocks 170-a, 170-b, 170-c, and 170-d may be collectively referred to as a virtual block 180. In some cases, a virtual block may include blocks 170 from different memory devices 130 (e.g., including blocks in one or more planes of memory device 130-a and memory device 130-b). In some cases, the blocks 170 within a virtual block may have the same block address within their respective planes 165 (e.g., block 170-a may be "block 0" of plane 165-a, block 170-b may be "block 0" of plane 165-b, and so on). In some cases, performing concurrent operations in different planes 165 may be subject to one or more restrictions, such as concurrent operations being performed on memory cells within different pages 175 that have the same page address within their respective planes 165 (e.g., related to command decoding, page address decoding circuitry, or other circuitry being shared across planes 165).

In some cases, a block 170 may include memory cells organized into rows (pages 175) and columns (e.g., strings, not shown). For example, memory cells in a same page 175 may share (e.g., be coupled with) a common word line, and memory cells in a same string may share (e.g., be coupled with) a common digit line (which may alternatively be referred to as a bit line).

For some NAND architectures, memory cells may be read and programmed (e.g., written) at a first level of granularity (e.g., at the page level of granularity) but may be erased at a second level of granularity (e.g., at the block level of granularity). That is, a page 175 may be the smallest unit of memory (e.g., set of memory cells) that may be independently programmed or read (e.g., programed or read concurrently as part of a single program or read operation), and a block 170 may be the smallest unit of memory (e.g., set of memory cells) that may be independently erased (e.g., erased concurrently as part of a single erase operation). Further, in some cases, NAND memory cells may be erased before they can be re-written with new data. Thus, for example, a used page 175 may, in some cases, not be updated until the entire block 170 that includes the page 175 has been erased.

In some cases, to update some data within a block 170 while retaining other data within the block 170, the memory device 130 may copy the data to be retained to a new block 170 and write the updated data to one or more remaining pages of the new block 170. The memory device 130 (e.g., the local controller 135) or the memory system controller 115 may mark or otherwise designate the data that remains in the old block 170 as invalid or obsolete and may update a logical-to-physical (L2P) mapping table to associate the logical address (e.g., LBA) for the data with the new, valid block 170 rather than the old, invalid block 170. In some cases, such copying and remapping may be performed instead of erasing and rewriting the entire old block 170 due to latency or wearout considerations, for example. In some cases, one or more copies of an L2P mapping table may be stored within the memory cells of the memory device 130 (e.g., within one or more blocks 170 or planes 165) for use (e.g., reference and updating) by the local controller 135 or memory system controller 115.

In some cases, a memory system controller 115 or a local controller 135 may perform operations (e.g., as part of one or more media management algorithms) for a memory device 130, such as wear leveling, background refresh, garbage collection, scrub, block scans, health monitoring, or others, or any combination thereof. For example, within a memory device 130, a block 170 may have some pages 175 containing valid data and some pages 175 containing invalid data. To avoid waiting for all of the pages 175 in the block 170 to have invalid data in order to erase and reuse the block 170, an algorithm referred to as "garbage collection" may be invoked to allow the block 170 to be erased and released as a free block for subsequent write operations. Garbage collection may refer to a set of media management operations that include, for example, selecting a block 170 that contains valid and invalid data, selecting pages 175 in the block that contain valid data, copying the valid data from the selected pages 175 to new locations (e.g., free pages 175 in another block 170), marking the data in the previously selected pages 175 as invalid, and erasing the selected block 170. As a result, the quantity of blocks 170 that have been erased may be increased such that more blocks 170 are available to store subsequent data (e.g., data subsequently received from the host system 105).

In some cases, a memory system 110 may utilize a memory system controller 115 to provide a managed memory system that may include, for example, one or more memory arrays and related circuitry combined with a local (e.g., on-die or in-package) controller (e.g., local controller 135). An example of a managed memory system is a managed NAND (MNAND) system.

The system 100 may include any quantity of non-transitory computer readable media that supports error notification using an external channel. For example, the host system 105 (e.g., a host system controller 106), the memory system 110 (e.g., a memory system controller 115), or a memory device 130 (e.g., a local controller 135) may include or otherwise may access one or more non-transitory computer readable media storing instructions (e.g., firmware, logic, code) for performing the functions ascribed herein to the host system 105, the memory system 110, or a memory device 130. For example, such instructions, if executed by the host system 105 (e.g., by a host system controller 106), by the memory system 110 (e.g., by a memory system controller 115), or by a memory device 130 (e.g., by a local controller 135), may cause the host system 105, the memory system 110, or the memory device 130 to perform associated functions as described herein.

In some cases, a memory system 110 having a host-driven logical block interface may issue a notification of a detected error using an out of band channel (e.g., a channel external to the host-driven logical block interface). For example, after receiving a data unit from a host system 105 but prior to storing data of the data unit in a memory device 130 of the memory system 110, the memory system 110 may transmit an acknowledgment to host system 105 to indicate that the data unit was successfully received. As part of storing the data, the memory system 110 may transfer the data along data paths between various components, such as a data storage controller, a buffer, and an encoder/decoder, and perform parity checks at one or more of the components. If the memory system 110 detects an error along a data path, the memory system 110 may issue a notification of the error to the host system 105 over the out of band channel. Additionally or alternatively, the memory system 110 may check for errors in the data as part of a maintenance operation, such as garbage collection. If the memory system 110 detects an error during a maintenance operation, the memory system 110 may transmit an indication of the error over the out of band channel. In some cases, the memory system 110 may store information about the error in a register accessible by the host system 105, and the host system 105 may read the register to determine additional information about the error.

FIG. 2 illustrates an example of a system 200 that supports error notification using an external channel in accordance with examples as disclosed herein. The system 200 may be an example of a system 100 as described with reference to FIG. 1 or aspects thereof. The system 200 may include a memory system 210 configured to store data received from a host system 205 and to send data to the host system 205, if requested by the host system 205 using access commands (e.g., read commands or write commands). The system 200 may implement aspects of the system 100 as described with reference to FIG. 1. For example, the memory system 210 and the host system 205 may be examples of the memory system 110 and the host system 105, respectively.

The memory system 210 may include memory devices 240 to store data transferred between the memory system 210 and the host system 205, e.g., in response to receiving access commands from the host system 205, as described herein. The memory devices 240 may include one or more memory devices as described with reference to FIG. 1. For example, the memory devices 240 may include NAND memory, PCM, self-selecting memory, 3D cross point, other chalcogenide-based memories, FERAM, MRAM, NOR (e.g., NOR flash) memory, STT-MRAM, CBRAM, RRAM, or OxRAM.

The memory system 210 may include a storage controller 230 for controlling the passing of data directly to and from the memory devices 240, e.g., for storing data, retrieving data, and determining memory locations in which to store data and from which to retrieve data. The storage controller 230 may communicate with memory devices 240 directly or via a bus (not shown) using a protocol specific to each type of memory device 240. In some cases, a single storage controller 230 may be used to control multiple memory devices 240 of the same or different types. In some cases, the memory system 210 may include multiple storage controllers 230, e.g., a different storage controller 230 for each type of memory device 240. In some cases, a storage controller 230 may implement aspects of a local controller 135 as described with reference to FIG. 1.

The memory system 210 may additionally include an interface 220 for communication with the host system 205 and a buffer 225 for temporary storage of data being transferred between the host system 205 and the memory devices 240. The interface 220, buffer 225, and storage controller 230 may be for translating data between the host system 205 and the memory devices 240, e.g., as shown by a data path 250, and may be collectively referred to as data path components.

Using the buffer 225 to temporarily store data during transfers may allow data to be buffered as commands are being processed, thereby reducing latency between commands and allowing arbitrary data sizes associated with commands. This may also allow bursts of commands to be handled, and the buffered data may be stored or transmitted (or both) once a burst has stopped. The buffer 225 may include relatively fast memory (e.g., some types of volatile memory, such as SRAM or DRAM) or hardware accelerators or both to allow fast storage and retrieval of data to and from the buffer 225. The buffer 225 may include data path switching components for bi-directional data transfer between the buffer 225 and other components.

The temporary storage of data within a buffer 225 may refer to the storage of data in the buffer 225 during the execution of access commands. That is, upon completion of an access command, the associated data may no longer be maintained in the buffer 225 (e.g., may be overwritten with data for additional access commands). In addition, the buffer 225 may be a non-cache buffer. That is, data may not be read directly from the buffer 225 by the host system 205. For example, read commands may be added to a queue without an operation to match the address to addresses already in the buffer 225 (e.g., without a cache address match or lookup operation).

The memory system 210 may additionally include a memory system controller 215 for executing the commands received from the host system 205 and controlling the data path components in the moving of the data. The memory system controller 215 may be an example of the memory system controller 115 as described with reference to FIG. 1. A bus 235 may be used to communicate between the system components.

In some cases, one or more queues (e.g., a command queue 260, a buffer queue 265, and a storage queue 270) may be used to control the processing of the access commands and the movement of the corresponding data. This may be beneficial, e.g., if more than one access command from the host system 205 is processed concurrently by the memory system 210. The command queue 260, buffer queue 265, and storage queue 270 are depicted at the interface 220, memory system controller 215, and storage controller 230, respectively, as examples of a possible implementation. However, queues, if used, may be positioned anywhere within the memory system 210.

Data transferred between the host system 205 and the memory devices 240 may take a different path in the memory system 210 than non-data information (e.g., commands, status information). For example, the system components in the memory system 210 may communicate with each other using a bus 235, while the data may use the data path 250 through the data path components instead of the bus 235. The memory system controller 215 may control how and if data is transferred between the host system 205 and the memory devices 240 by communicating with the data path components over the bus 235 (e.g., using a protocol specific to the memory system 210).

If a host system 205 transmits access commands to the memory system 210, the commands may be received by the interface 220, e.g., according to a protocol (e.g., a UFS protocol or an eMMC protocol). Thus, the interface 220 may be considered a front end of the memory system 210. Upon receipt of each access command, the interface 220 may communicate the command to the memory system controller 215, e.g., via the bus 235. In some cases, each command may be added to a command queue 260 by the interface 220 to communicate the command to the memory system controller 215.

The memory system controller 215 may determine that an access command has been received based on the communication from the interface 220. In some cases, the memory system controller 215 may determine the access command has been received by retrieving the command from the command queue 260. The command may be removed from the command queue 260 after it has been retrieved therefrom, e.g., by the memory system controller 215. In some cases, the memory system controller 215 may cause the interface 220, e.g., via the bus 235, to remove the command from the command queue 260.

Upon the determination that an access command has been received, the memory system controller 215 may execute the access command. For a read command, this may mean obtaining data from the memory devices 240 and transmitting the data to the host system 205. For a write command, this may mean receiving data from the host system 205 and moving the data to the memory devices 240.

In either case, the memory system controller 215 may use the buffer 225 for, among other things, temporary storage of the data being received from or sent to the host system 205. The buffer 225 may be considered a middle end of the memory system 210. In some cases, buffer address management (e.g., pointers to address locations in the buffer 225) may be performed by hardware (e.g., dedicated circuits) in the interface 220, buffer 225, or storage controller 230.

To process a write command received from the host system 205, the memory system controller 215 may first determine if the buffer 225 has sufficient available space to store the data associated with the command. For example, the memory system controller 215 may determine, e.g., via firmware (e.g., controller firmware), an amount of space within the buffer 225 that may be available to store data associated with the write command.

In some cases, a buffer queue 265 may be used to control a flow of commands associated with data stored in the buffer 225, including write commands. The buffer queue 265 may include the access commands associated with data currently stored in the buffer 225. In some cases, the commands in the command queue 260 may be moved to the buffer queue 265 by the memory system controller 215 and may remain in the buffer queue 265 while the associated data is stored in the buffer 225. In some cases, each command in the buffer queue 265 may be associated with an address at the buffer 225. That is, pointers may be maintained that indicate where in the buffer 225 the data associated with each command is stored. Using the buffer queue 265, multiple access commands may be received sequentially from the host system 205 and at least portions of the access commands may be processed concurrently.

If the buffer 225 has sufficient space to store the write data, the memory system controller 215 may cause the interface 220 to transmit an indication of availability to the host system 205 (e.g., a "ready to transfer" indication), e.g., according to a protocol (e.g., a UFS protocol or an eMMC protocol). As the interface 220 subsequently receives from the host system 205 the data associated with the write command, the interface 220 may transfer the data to the buffer 225 for temporary storage using the data path 250. In some cases, the interface 220 may obtain from the buffer 225 or buffer queue 265 the location within the buffer 225 to store the data. The interface 220 may indicate to the memory system controller 215, e.g., via the bus 235, if the data transfer to the buffer 225 has been completed.

Once the write data has been stored in the buffer 225 by the interface 220, the data may be transferred out of the buffer 225 and stored in a memory device 240. This may be done using the storage controller 230. For example, the memory system controller 215 may cause the storage controller 230 to retrieve the data out of the buffer 225 using the data path 250 and transfer the data to a memory device 240. The storage controller 230 may be considered a back end of the memory system 210. The storage controller 230 may indicate to the memory system controller 215, e.g., via the bus 235, that the data transfer to a memory device of the memory devices 240 has been completed.

In some cases, a storage queue 270 may be used to aid with the transfer of write data. For example, the memory system controller 215 may push (e.g., via the bus 235) write commands from the buffer queue 265 to the storage queue 270 for processing. The storage queue 270 may include entries for each access command. In some examples, the storage queue 270 may additionally include a buffer pointer (e.g., an address) that may indicate where in the buffer 225 the data associated with the command is stored and a storage pointer (e.g., an address) that may indicate the location in the memory devices 240 associated with the data. In some cases, the storage controller 230 may obtain from the buffer 225, buffer queue 265, or storage queue 270 the location within the buffer 225 from which to obtain the data. The storage controller 230 may manage the locations within the memory devices 240 to store the data (e.g., performing wear-leveling, garbage collection, and the like). The entries may be added to the storage queue 270, e.g., by the memory system controller 215. The entries may be removed from the storage queue 270, e.g., by the storage controller 230 or memory system controller 215 upon completion of the transfer of the data.

To process a read command received from the host system 205, the memory system controller 215 may again first determine if the buffer 225 has sufficient available space to store the data associated with the command. For example, the memory system controller 215 may determine, e.g., via firmware (e.g., controller firmware), an amount of space within the buffer 225 that may be available to store data associated with the read command.

In some cases, the buffer queue 265 may be used to aid with buffer storage of data associated with read commands in a similar manner as discussed with respect to write commands. For example, if the buffer 225 has sufficient space to store the read data, the memory system controller 215 may cause the storage controller 230 to retrieve the data associated with the read command from a memory device 240 and store the data in the buffer 225 for temporary storage using the data path 250. The storage controller 230 may indicate to the memory system controller 215, e.g., via the bus 235, when the data transfer to the buffer 225 has been completed.

In some cases, the storage queue 270 may be used to aid with the transfer of read data. For example, the memory system controller 215 may push the read command to the storage queue 270 for processing. In some cases, the storage controller 230 may obtain from the buffer 225 or storage queue 270 the location within the memory devices 240 from which to retrieve the data. In some cases, the storage controller 230 may obtain from the buffer queue 265 the location within the buffer 225 to store the data. In some cases, the storage controller 230 may obtain from the storage queue 270 the location within the buffer 225 to store the data. In some cases, the memory system controller 215 may move the command processed by the storage queue 270 back to the command queue 260.

Once the data has been stored in the buffer 225 by the storage controller 230, the data may be transferred out of the buffer 225 and sent to the host system 205. For example, the memory system controller 215 may cause the interface 220 to retrieve the data out of the buffer 225 using the data path 250 and transmit the data to the host system 205, e.g., according to a protocol (e.g., a UFS protocol or an eMMC protocol). For example, the interface 220 may process the command from the command queue 260 and may indicate to the memory system controller 215, e.g., via the bus 235, that the data transmission to the host system 205 has been completed.

The memory system controller 215 may execute received commands according to an order (e.g., a first-in, first-out order, according to the order of the command queue 260). For each command, the memory system controller 215 may cause data corresponding to the command to be moved into and out of the buffer 225, as discussed herein. As the data is moved into and stored within the buffer 225, the command may remain in the buffer queue 265. A command may be removed from the buffer queue 265, e.g., by the memory system controller 215, if the processing of the command has been completed (e.g., if data corresponding to the access command has been transferred out of the buffer 225). If a command is removed from the buffer queue 265, the address previously storing the data associated with that command may be available to store data associated with a new command.

The memory system controller 215 may additionally be configured for operations associated with the memory devices 240. For example, the memory system controller 215 may execute or manage operations such as wear-leveling operations, garbage collection operations, error control operations such as error-detecting operations or error-correcting operations, encryption operations, caching operations, media management operations, background refresh, health monitoring, and address translations between logical addresses (e.g., LBAs) associated with commands from the host system 205 and physical addresses (e.g., physical block addresses) associated with memory cells within the memory devices 240. That is, the host system 205 may issue commands indicating one or more LBAs and the memory system controller 215 may identify one or more physical block addresses indicated by the LBAs. In some cases, one or more contiguous LBAs may correspond to noncontiguous physical block addresses. In some cases, the storage controller 230 may be configured to perform one or more of the described operations in conjunction with or instead of the memory system controller 215. In some cases, the memory system controller 215 may perform the functions of the storage controller 230 and the storage controller 230 may be omitted.

In some cases, a memory system 210 having a host-driven logical block interface, such as the interface 220, may issue a notification of a detected error using an out of band channel (e.g., a channel external to the host-driven logical block interface). For example, after receiving a data unit from a host system 205 but prior to storing the data of the data unit in a memory device 240 of the memory system 210, the memory system 210 may transmit an acknowledgment to host system 205 to indicate that the data unit was successfully received. As part of storing the data, the memory system 210 may transfer the data along data paths 250 between various components, such as a data storage controller (e.g., a storage controller 230), a buffer (e.g., a buffer 225), and an encoder/decoder, and perform parity checks at each component. If the memory system 210 detects an error along a data path 250, the memory system 210 may issue a notification of the error to the host system 205 over the out of band channel. Additionally or alternatively, the memory system 210 may check for errors in the data as part of a maintenance operation, such as garbage collection. If the memory system 210 detects an error during a maintenance operation, the memory system 210 may transmit an indication of the error over the out of band channel. In some cases, the memory system 210 may store information about the error in a register, and the host system 205 may read the register to determine additional information about the error.

Figure 3:
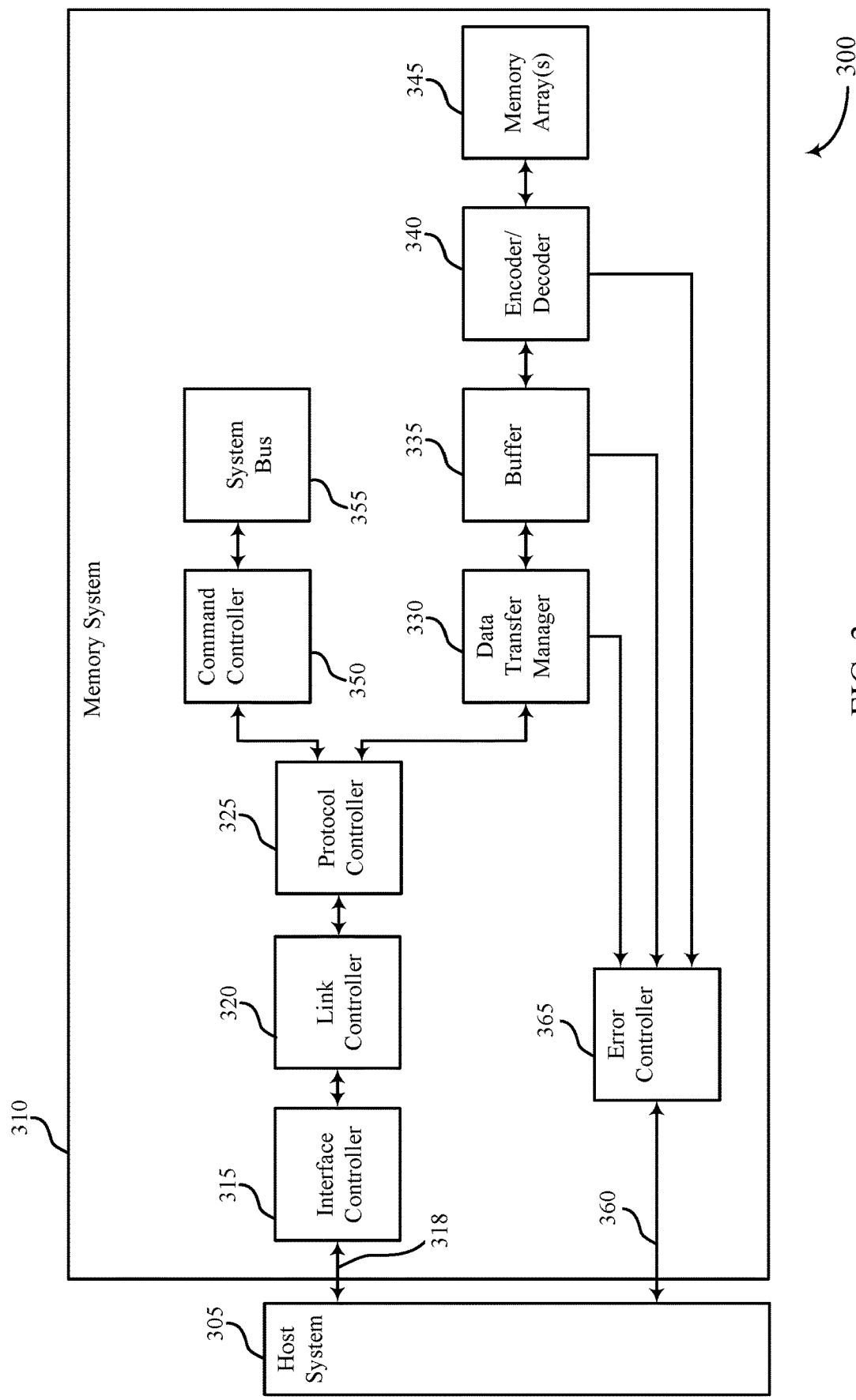
FIG. 3 illustrates an example of a system that supports error notification using an external channel in accordance with examples as disclosed herein.

FIG. 3 illustrates an example of a system 300 that supports error notification using an external channel in accordance with examples as disclosed herein. In some examples, the system 300 may include a host system 305 and a memory system 310. The host system 305 and the memory system 310 may be examples of the host system 205 and the memory system 210, respectively, as described with reference to FIG. 2. The memory system 310 may include an interface controller 315, a link controller 320, and a protocol controller 325. The memory system 310 may also include a data transfer manager (DTM) 330, a buffer 335, an encoder/decoder 340, an error controller 365, and one or more memory arrays 345, which may be utilized when processing data. For example, the memory arrays 345 may include one or more memory devices, and each memory device may include one or more memory die (e.g., one or more NAND memory die).

Additionally or alternatively, the memory system 310 may include a command controller 350 and a system bus 355 which may be utilized when processing control information. The components of the memory system 310 may be configured to generate parity bits and perform error detection and correction operations associated with data paths of the memory system 310. By generating parity bits and/or check codes (and performing associated error detection operations) associated with the data storage unit and codewords, errors that occur along the data path of the memory system may be detected, which may improve the overall performance and reliability of the memory system.

The host system 305 may communicate with the memory system 310 via a host-driven logical block interface 318 (e.g., an interface managed by the host system 305). For example, the host system 305 may transmit packets that include one or more payloads. As used herein, a data block may include data (e.g., data from respective payloads) from one or more packets received from the host system 305. In some instances, the payloads may be associated with respective commands (e.g., read commands, write commands, other commands) received from the host system 305. For example, the host system 305 may transmit a write command and one or more packets (e.g., that collectively correspond to a data block) to the memory system 310. Thus, a data block may refer to a unit of data transferred according to block access commands (e.g., a minimum addressable block size). The packets may be received by the interface controller 315 and commands included in the packets may be processed by the protocol controller 325.

In some examples, the host system 305 may communicate the packets to the interface controller 315, which may utilize a UniPro® protocol stack and may include a physical interface that includes one or more serial data lanes. As described herein, the interface controller 315 may be configured to generate protocol units (e.g., upon receiving a write command from the host system 305) and data units (e.g., upon receiving a read command from the host system 305) for communicating to the link controller 320 and the host system 305, respectively.

The memory system 310 may include a link controller 320 that is coupled with the interface controller 315. In some instances, the link controller 320 may be referred to as a Universal Flash Storage (UFS) link controller 320, and may operate according to a UFS protocol. The link controller 320 may receive protocol units from the interface controller 315, in the instance of a write operation, and may communicate the protocol units to the protocol controller 325. In the instance of read operations, the link controller 320 may receive protocol units from the protocol controller 325 and may communicate the protocol units to the interface controller 315.

In some examples, the memory system 310 may include a protocol controller 325 that is coupled with the link controller 320. The protocol controller 325 may operate according to a UFS protocol and may receive protocol units from the link controller 320 (e.g., during a write operation). As described herein, the interface controller 315 may utilize a UniPro® protocol stack. However, upon receiving a command (e.g., a read command) and performing certain operations on fields of the command to generate a protocol unit, the protocol unit may be communicated to the protocol controller 325 using signaling that is the same as or resembles UFS signaling (e.g., conforms to a UFS protocol). When the protocol controller 325 receives the protocol unit, it can either communicate the protocol unit to the DTM 330 if the protocol unit is associated with data or to the command controller 350 if the protocol unit is associated with control information.

The DTM 330 may receive (e.g., obtain) and process the protocol unit. In some examples, the DTM 330 may process the protocol unit to obtain a data storage unit, which may be written to a memory array 345. Before the data storage unit is written to a memory array 345, the DTM 330 may process one or more protocol units to generate the data storage unit. For example, the DTM 330 may generate the (e.g., build) the data storage unit using one or more protocol units. The DTM 330 may then generate respective sets of parity bits using data in the data storage units to compare with parity bits included in each protocol unit. If the sets of parity bits match, the DTM 330 may determine that the data storage unit was generated correctly. In some examples, a data storage unit may include at least portions (e.g., information from data fields) of more than one protocol unit (e.g., a plurality of protocol units), however in some examples a data storage unit may include one protocol unit. Upon generating the data storage unit, the DTM 330 may generate a check code (e.g., an E2E CRC) using the data storage unit. For example, the check code may be generated using the data included in the data storage unit, which may correspond to the data block (e.g., data corresponding to a block of LBAs that are accessed as part of an access operation according to the protocol used by the protocol controller 325) received from the host system 305. As described herein, the check code may allow for the identification of any errors in the data that occurred while the data is within the memory system 310.

Additionally or alternatively, the protocol controller 325 may communicate a protocol unit associated with control information to the command controller 350. As used herein, the term control information may refer to any information associated with a command received from the host system 305 other than data to be read from or written to a memory array 345. In some examples, the protocol unit comprising the control information may be processed by the command controller 350 and may be communicated to a system bus 355. The system bus 355 may communicate the control information to a portion or component of the memory system 310 associated with the control information. The system bus 355 may be an example of the bus 235 of FIG. 2.

After generating the data storage unit that includes the data from the data block and corresponding check code, the DTM 330 may break the data storage unit into one or more data words. As used herein, a data word may correspond to a size of data that is smaller than the data storage unit. Additionally or alternatively, each data word may be a same or a different size than a protocol unit. The respective data words may be transmitted by the DTM 330 to the buffer 335. In some examples, a communication channel between the DTM and the buffer 335 may include at least one bit (e.g., at least one parity bit) used for bus parity. For example, the data words may be transferred over the communication channel by way of a quantity of data channels (e.g., 8, 16, 32, 64) and a quantity of data cycles (e.g., 8, 16, 32, 64). The communication channel may include one or more bus parity channels which may carry parity information associated with the data channels for each data cycle. When a data word is received by the buffer 335, the buffer 335 may generate at least one bit (e.g., for each data cycle) to determine whether an error occurred between the DTM 330 and the buffer 335 (e.g., when the data word was transmitted on the bus between the DTM 330 and the buffer 335). Accordingly, the buffer 335 may compare the parity information with the generated bits. In some cases, if the compared bits do not match, then an error may have occurred in a data path between the DTM 330 and the buffer 335. In such instances, signaling may be generated to indicate to the host system 305 that an error was detected. For example, the error controller 365 may process error indications from the buffer 335 and may, using an out of band channel 360, issue an indication of the error to host system 305.

The encoder/decoder 340 may read the codewords from the buffer 335. The communication channel between the buffer and the encoder/decoder 340 may also include a quantity of data channels (e.g., 8, 16, 32, 64) and one or more bus parity channels. When the encoder/decoder 340 receives a data word, the encoder/decoder 340 may generate at least one bit to determine whether an error occurred between the buffer 335 and the encoder/decoder 340 (e.g., when the data word was transmitted on the communication channel between the buffer 335 and the encoder/decoder 340). Accordingly, the encoder/decoder 340 may compare the parity information with the generated bits. In some cases, if the compared bits do not match, then an error may have occurred in a data path between the buffer 335 and the encoder/decoder 340. In such instances, signaling may be generated to indicate to the host system 305 that an error was detected. For example, the error controller 365 may process error indications from the encoder/decoder 340 and may, using the out of band channel 360, issue an indication of the error to host system 305.

Additionally or alternatively, if no errors are detected, the encoder/decoder 340 may encode the data words according to a first error protection scheme to create codewords (e.g., first codewords) from each data word and may store the respective codewords to the memory array(s) 345. For example, the first error protection scheme may be a linear block code (e.g., LDPC) that generates codewords with first error protection codes. For example, each codeword may include systematic bits and parity bits generated according to the first error protection scheme.

In some cases, the buffer 335 may include a second error protection scheme to detect errors, correct errors, or both, in data words stored to the buffer 335. For example, the buffer may include a second error protection scheme (e.g., a SEC or SECDED error protection scheme). If no errors are detected from the bus parity on data words received from the DTM, the buffer 335 may generate a codeword (e.g., a SECDED codeword, a second codeword) for each data word and may store the respective second codewords to the buffer 335. Additionally or alternatively, the buffer may first generate the second codewords, and subsequently perform the second error protection scheme. For example, the codeword may include the data bits of the data word and a second error protection code. Upon outputting codewords read by the encoder/decoder 340, the buffer 335 may run an error protection process according to the second error protection scheme to identify, or to correct, or both, any errors that occurred while the respective data was stored to the buffer 335. For example, the buffer 335 may generate, for each second codeword, a syndrome based at least in part on a data portion of each second codeword and the second error protection code of each second codeword. If no errors exist for a codeword (e.g., the syndrome for each second codeword of the plurality of second codewords indicating no errors or correctable errors in each second codeword), the buffer 335 may recreate the data word from the respective codeword and may transmit the data words to the encoder/decoder 340. If the syndrome for one or more of the codewords indicates the presence of an error, the buffer 335 may corrupt at least one bit of the one or more codewords based at least in part on the second error protection code indicating a non-correctable error. Additionally or alternatively, signaling may be generated to indicate to the host system 305 that an error was detected. For example, the error controller 365 may process error indications from the buffer 335 and may, using an out of band channel 360, issue an indication of the error to host system 305. Accordingly, the plurality of first codewords may be stored to the memory array(s) 345. The data associated with each codeword of the plurality of first codewords may be or may represent data associated with the data block received from the host system 305.

When a command is received by the protocol controller 325 and the command controller 350 to read the data block, the codewords of the plurality of first codewords may be read from the memory array(s) 345 by the encoder/decoder 340. The encoder/decoder 340 may run a decoding process according to the first error protection scheme on each codeword of the plurality of first codewords to generate the data words. In some cases, the decoding process may generate the most probable candidate data word from each codeword (e.g., a decoding process for a linear block code).

The encoder/decoder 340 may then send each of the data words to the buffer 335 (e.g., over the communication channel including bus parity). The buffer 335 may again check the parity information received with the data over the bus parity, and may store the data words. In some cases, if the buffer 335 detects an error using the parity information, signaling may be generated to indicate to the host system 305 that an error was detected. For example, the error controller 365 may process error indications from the buffer 335 and may, using an out of band channel 360, issue an indication of the error to host system 305. Additionally or alternatively, the buffer 335 may encode the data words received from the encoder/decoder according to the second error protection scheme, and may, upon the DTM 330 reading the data words from the buffer, run the error protection process according to the second error protection scheme to identify, or to correct, or both, any errors that occurred while the respective data was stored to the buffer 335. In some cases, if the DTM 330 detects an error, signaling may be generated to indicate to the host system 305 that an error was detected. For example, the error controller 365 may process error indications from the DTM 330 and may, using an out of band channel 360, issue an indication of the error to host system 305.

Although the buffer 335 and the encoder/decoder 340 may employ error protection schemes on data words to obtain the first and second codewords, the error protection schemes may return corrupt data in some circumstances. For example, an error protection scheme such as LDPC or SECDED may return an erroneous data word when there are a quantity of bit errors exceeding a threshold without an indication that an error has occurred. Additionally, the bus parity on the communication channels between the DTM 330 and the buffer 335, and the buffer 335 and the encoder/decoder 340 may only be able to detect single bit errors within a quantity (e.g., 8, 16) data bits. Thus, one or more bits may become corrupt in data words stored to the memory array(s) 345 or retrieved from the memory array(s) 345. In addition to the data of the data block being stored to the memory array(s) 345, the check code may be stored as part of the codewords associated with the data block such that, when the data is read from the memory array(s) 345 (e.g., when the individual first codewords are each read), a check value can be generated and compared with the check code to determine whether the data is associated with an error. Because the check code of the data block may be run on a larger quantity of bits (e.g., of the data block), and may include a larger quantity of parity bits than the error protection schemes for the data words, the check code may detect if any of the data words are erroneous as a result of being stored at the buffer. Accordingly, by employing an E2E CRC (as well as other error detection and correction schemes), the overall performance and reliability of the memory system 310 may be improved.

The memory system 310 may perform various operations on the data of the data storage unit outside of operations associated with access commands (e.g., read commands, write commands, or erase commands) received from the host system 305 for the data. For example, the memory system 310 may perform one or more maintenance operations, such as garbage collection, wear-leveling, scanning, folding, or any combination thereof, on blocks of memory cells of the memory array 345. As part of the maintenance operations, the memory system 310 may move the data between various components of the memory system 310. For example, as part of a garbage collection operation, the memory system 310 may transfer the data storage unit from the memory array 345 to the buffer 335 (e.g., through the encoder/decoder 340). Accordingly, the memory array 345, the encoder/decoder 340, the buffer 335, or any combination thereof may generate and compare parity bits and check bits (e.g., using the first error control scheme or the second error control scheme) to determine whether an error occurred in the data path between the components of the memory system 310. In such instances, signaling may be generated to indicate to the host system 305 that an error was detected. For example, the error controller 365 may process error indications from the components of the memory system 310 and may, using an out of band channel 360, issue an indication of the error to host system 305.

Additionally or alternatively, the memory system 310 may monitor for errors not directly related to the data storage unit. For example, the memory system 310 may monitor parameters such as a temperature (e.g., a temperature of the memory array 345, a temperature of the buffer 335, or other components of the memory system 310) or supply voltages (e.g., supply voltages received from the host system 305). In some cases, if the memory system determines that a monitored parameter is out of an acceptable range (e.g., if the temperature exceeds a threshold, if a supply voltage is not within an operating range), signaling may be generated to indicate to the host system 305 that an error was detected. For example, the error controller 365 may process error indications from the components of the memory system 310 and may, using an out of band channel 360, issue an indication of the error to host system 305.

In some cases, the out of band channel 360 may be an example of a general purpose input/output pin, which may be external to the interface controller 315. For example, upon determining an error (e.g., by the DTM 330, the buffer 335, the encoder/decoder 340, the memory array 345, or any combination thereof), the out of band channel 360 may be asserted (e.g., set to a high voltage) to notify the host system 305 of the error. Accordingly, the host system 305 may receive the indication, for example as part of monitoring the out of band channel 360, and transmit one or more commands to further diagnose, and in some cases correct, the detected error. In some examples, the memory system 310 may store information associated with the error (e.g., a logical block address associated with the error, a quantity of detected errors, whether the memory system attempted to correct the error, among other examples) in a register accessible by the host system 305.

Figure 4A:
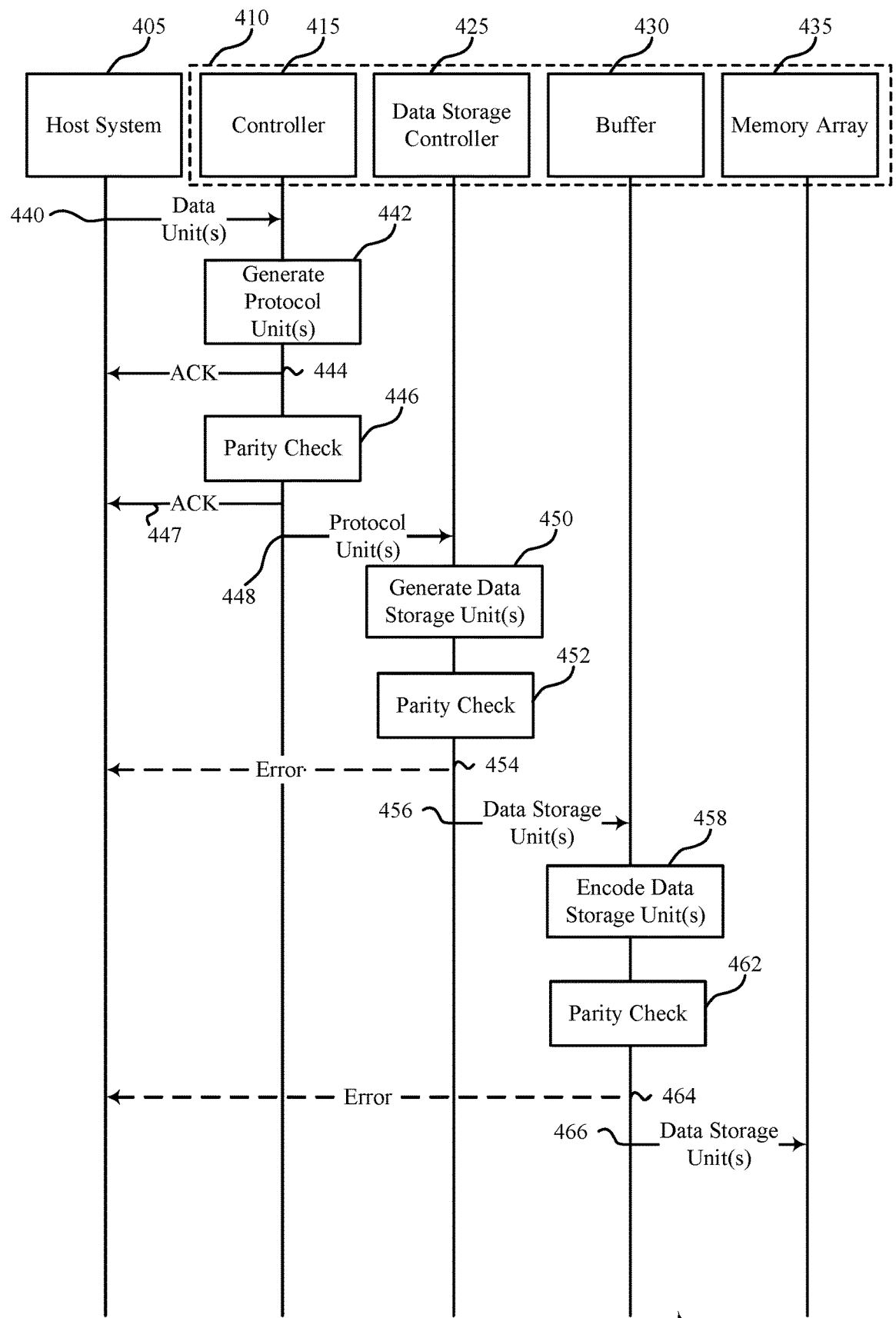
FIGS. 4A and 4B illustrate examples of process flows that support error notification using an external channel in accordance with examples as disclosed herein.

FIG. 4A illustrates an example of a process flow 400-a that supports error notification using an external channel in accordance with examples as disclosed herein. In some examples, the process flow 400-a may illustrate a write operation performed at a memory system 410. The memory system 410 may be coupled with a host system 405 and may include a controller 415, a data storage controller 425, a buffer 430, and a memory array 435. In some examples, the data storage controller 425, the buffer 430, and the memory array 435 may be examples of the DTM 330, the buffer 335, and the memory array 345 as described with reference to FIG. 3. In some examples, the controller 415 may include an interface controller, a link controller, a protocol controller, or any combination thereof, as described with reference to FIG. 3. The memory system 410 may include other components, such as the components described with reference to FIG. 3, that are not shown. The process flow 400-a may illustrate the processing and generation of data units, protocol units, and data storage units, which may allow for asynchronous transmission of an indication of detected errors in data paths of the memory system 410 (e.g., transmissions not associated with or in response to a command from the host system 405), which may improve the reliability and performance of the host system 405 and the memory system 410.

At 440, the host system 405 may transmit one or more data units to the memory system 410. For example, the host system 405 may transmit a data unit that includes a set of fields (e.g., a header field and a payload field, as described with reference to FIG. 3) and a first set of parity bits associated with the set of fields. The first set of parity bits may be referred to as CRC parity bits.

At 442, the controller 415 may generate a protocol unit (e.g., a UPIU) using the data unit. In some cases, the protocol unit may include data that is associated with a same destination device ID and/or a same destination port ID. Additionally, the controller 415 may generate a set of parity bits using the data and may include the set of parity bits in the protocol unit. In some examples, the controller 415 may refrain from including some fields or some information in the protocol unit. For example, the controller 415 may refrain from including a destination device ID or destination port ID fields in the protocol unit, and may also refrain from including the first set of parity bits. In some cases, controller 415 may transmit an ACK at 444 to the host system 405 to indicate that one or more protocol units associated with a command (e.g., write command) were successfully received. For example, the data associated with the command may be transferred in protocol units subsequent to the protocol unit associated with the command. The controller 415 may respond to the command after the protocol units of the data of the command have been received successfully. Thus, the ACK at 444 may be a response to the command, and may indicate that the data for the command has been successfully received.

At 446, the controller 415 may perform a parity check on the data of the protocol unit by generating a set of parity bits (e.g., check bits) associated with data of the protocol unit corresponding to a data unit. For example, the controller 415 may generate a set of check bits using data from the protocol unit. The controller 415 may compare the set of parity bits with the set of check bits. If the set of parity bits does not match the set of check bits, then an error may have occurred when transmitting the data (e.g., the associated data units) from the host system 405 to the memory system. In some cases, in response to determining that the parity bits match, the controller 415 may, at 447, transmit an acknowledgement (ACK) to the host system 405 to indicate that the data unit was successfully received.

At 448, the controller 415 may transmit the protocol unit to the data storage controller 425. In some examples, the controller 415 may transmit the protocol unit to the data storage controller 425 via a link controller and a protocol controller (e.g., a link controller 320 and a protocol controller 325 as described with reference to FIG. 3). In some cases, the protocol controller may perform a parity check on the data units to determine whether an error occurred as part of transferring the data unit from the interface controller to the protocol controller. If the protocol controller detects an error, the protocol controller may transmit an indication of the error to the host system 405, for example over the out of band channel 360.

At 450, the data storage controller 425 may process the protocol unit to obtain a data storage unit. To generate the data storage unit, the data storage controller 425 may selectively remove some data (e.g., some fields) from the protocol units. For example, some fields that do not include payload data or identify a destination location for the data may not be included in the data storage unit. Thus, a data storage unit may include, for example, data corresponding to the data block received from the host system 405 and a check code (e.g., a CRC) generated using the data block. The check code, which may be referred to as E2E CRC, may eventually be stored to a portion of a memory array 435 and may be used as part of an error detection operation when reading the associated data from the memory array 435. That is, the data storage unit and E2E CRC may be stored to a portion of the memory array after additional operations are performed by the buffer 430 and the encoder/decoder. In some cases, the generation of the E2E CRC may be seeded with the address for the data block (e.g., a first LBA of the data block).

At 452, the data storage controller 425 may perform a parity check on the data storage unit. To perform the parity check, the data storage controller 425 may generate a set of parity bits (e.g., check bits) associated with the data included in the data storage unit corresponding to the protocol unit. For example, the interface controller may generate a set of check bits using the data. The data storage controller 425 may compare the second set of parity bits with the second set of check bits. If the sets of parity bits do not match, then an error may have occurred in a data path between the controller 415 and the data storage controller 425. In such an instance, the data storage controller 425 may, at 454, transmit (e.g., via error controller 365) an indication of the error over an out of band channel (e.g., an out of band channel 360 as described with reference to FIG. 3) to the host system 405.

After generating the data storage unit and corresponding check code, the data storage controller 425 may break the data storage unit into one or more data words, which may each be a same or a different size than a protocol unit. At 456, the respective data words may be transmitted by the data storage controller 425 to the buffer 430 and may be sent over a communication channel including at least one parity bit used for bus parity (e.g., bus parity between the data storage controller 425 and the buffer 430). In some examples, the data storage controller 425 may transfer the data words to the buffer 430 via one or more buffer channels that couple the data storage controller 425 with the buffer 430.

At 458, an encoder/decoder (e.g., the encoder/decoder 340 as described with reference to FIG. 3) may read the data words from the buffer 430 to encode the data storage unit (e.g., the encoder/decoder may generate a codeword). The respective data words may be transmitted by the buffer 430 to the encoder/decoder and may be sent over a communication channel including at least one parity bit used for bus parity (e.g., bus parity between the buffer 430 and the encoder/decoder). In some cases, upon receiving the data words associated with the data storage unit, the encoder/decoder may, at 462, perform a parity check using the bus parity information, for example by generating a set of check bits and comparing the check bits with the bus parity. If the encoder/decoder detects an error, the encoder/decoder may, at 464, transmit (e.g., via error controller 365) an indication of the error over an out of band channel to the host system 405.

At 462, the buffer 430 may perform a parity check on one or more data words of the data storage unit (e.g., a portion protected by the fourth set of parity bits). To perform the parity check, the buffer 430 may generate a set of parity bits (e.g., check bits) associated with the data included in a data word and compare the generated parity bits with the bus parity information. If an error is detected, the buffer 430 may, at 460, transmit (e.g., via error controller 365) an indication of the error over an out of band channel (e.g., an out of band channel 360 as described with reference to FIG. 3) to the host system 405. In some cases, upon receiving the data storage unit or data words associated with the data storage unit, the buffer 430 may generate a codeword (e.g., a SECDED codeword, a second codeword) for each data word and may store the respective second codewords to the buffer 430. Additionally or alternatively, at 466, the encoder/decoder may generate a fifth set of parity bits for the data words associated with the data storage unit using a second error control scheme (e.g., a LDCP scheme) and transmit the data words associated with the data storage unit, including the fifth set of parity bits and the third set of parity bits, to the memory array 435. In some cases, the granularity of a portion of the payload of the data storage unit protected by the fifth set of parity bits may be different than the granularity of the portion of the payload of the data storage unit protected by the fourth set of parity bits. Accordingly, the encoded data and the third set of parity bits may be written to a portion of the memory array 435.

Figure 4B:
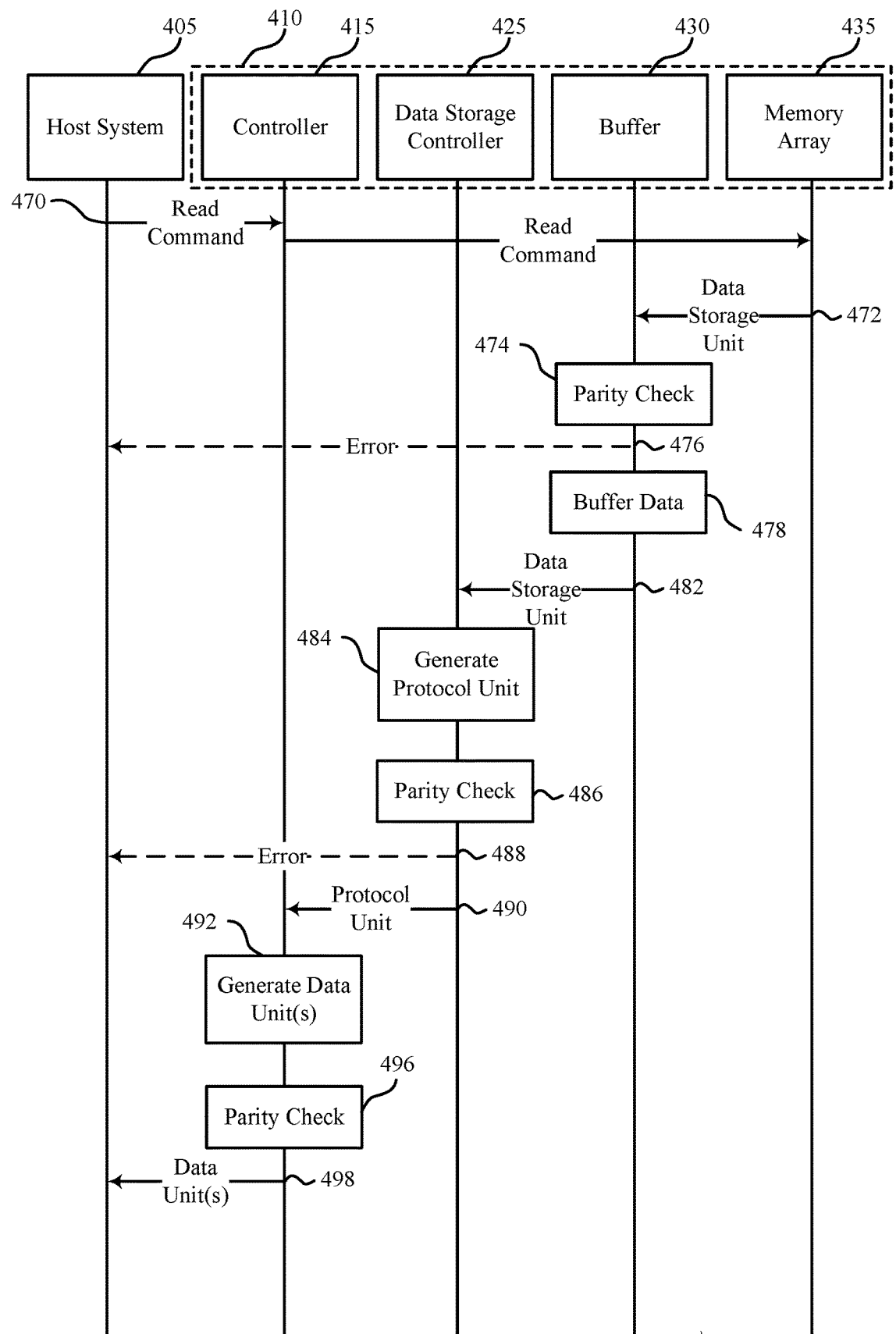

FIG. 4B illustrates an example of a process flow 400-*b* that supports error notification using an external channel in accordance with examples as disclosed herein. In some examples, the process flow 400-*b* may illustrate a read operation performed at a memory system 410. The memory system 410 may be a same memory system and may include the same components as described with reference to FIG. 4A. The process flow 400-*b* may illustrate the processing and generation of data units, protocol units, and data storage units, which may allow for the detection of errors in data paths of the memory system 410, which may improve its overall performance and reliability.

At 470, the host system 405 may transmit a read command to the memory system 410. The read command may be associated with data stored to the memory array 435. In some cases, the controller 415 may receive the read command from the host system 405 and may transmit the command to a command controller (e.g., the memory system controller 215 as described with reference to FIG. 2), which may further process the command. For example, at 472, the command controller may instruct an encoder/decoder (e.g., the encoder/decoder 340 as described with reference to FIG. 3) to retrieve one or more data words corresponding to a data storage unit associated with the read command from the memory array 435. The encoder/decoder may decode one or more data words and transmit the data words to the buffer 430. In some examples, the data words corresponding to the data storage unit may include data, a first set of parity bits associated with the data (e.g., end-to-end CRC parity bits configured to protect the entire payload of the data storage unit) and a second set of parity bits associated with the data, such as the set of parity bits generated using the second error control scheme at 462 (e.g., the LDPC bits, configured to protect a portion of the payload of the data storage unit), and may be associated with the read command received from the host system 405.

At 472, the command controller may instruct the data storage controller 425 to read the data words associated with the data storage unit from the buffer 430. In some cases, prior to transferring the data to the data storage controller 425, the buffer 430 or the encoder/decoder may, at 474, perform a parity check. For example, the data words of the data storage unit may be transmitted over a communication channel including at least one parity bit used for bus parity (e.g., bus parity between the buffer 430 and the encoder/decoder). If the encoder/decoder or the buffer 430 detects an error, an indication of the error may be transmitted at 476 over an out of band channel to the host system 405.

At 478, the buffer 430 may store the data storage unit prior to the data being transmitted to the host system 405. In some cases, the buffer 430 may generate a third set of parity bits using the SECDED scheme. In some cases, at 482, the data storage controller 425 may read the data storage unit from the buffer 430.

At 484, the data storage controller 425 may process the data storage unit to obtain one or more protocol units (e.g., UPIUs). Each protocol unit may include a portion of the data of the data storage unit, and may omit other portions (e.g., first set of parity bits, the second set of parity bits, the third set of parity bits).

At 486, the data storage controller 425 may perform a parity check on the data in the protocol units using the first set of parity bits (e.g., the end-to-end CRC bits). If the data storage controller 425 detects an error, the data storage controller 425 may, at 488, transmit an indication of the error over an out of band channel to the host system 405. Additionally or alternatively, the data storage controller 425 may perform a parity check using bus parity information associated with transferring the data storage unit from the buffer 430 to the data storage controller 425. At 490, the data storage controller 425 may transmit the protocol unit to the controller 415, for example via a protocol controller and a link controller (e.g., the protocol controller 325 and the link controller 320 as described with reference to FIG. 3).

At 492, the controller 415 may generate one or more data units. A first data unit may include a first set of fields that include the first portion of the first data and a fifth set of parity bits generated using the data. At 496, the controller 415 may perform a parity check on the one or more data units. To perform the parity check, the controller 415 may generate a set of check bits associated with the data of the one or more data units. The controller 415 may compare the fourth set of parity bits with the set of check bits. If the sets of parity bits do not match, then an error may have occurred in a data path between the data storage controller 425 and the controller 415. At 498, the controller 415 may transmit the one or more data units to the host system 405. In some examples, the host system 405 may perform a parity check on data units using the fifth set of parity bits.

Figure 5:
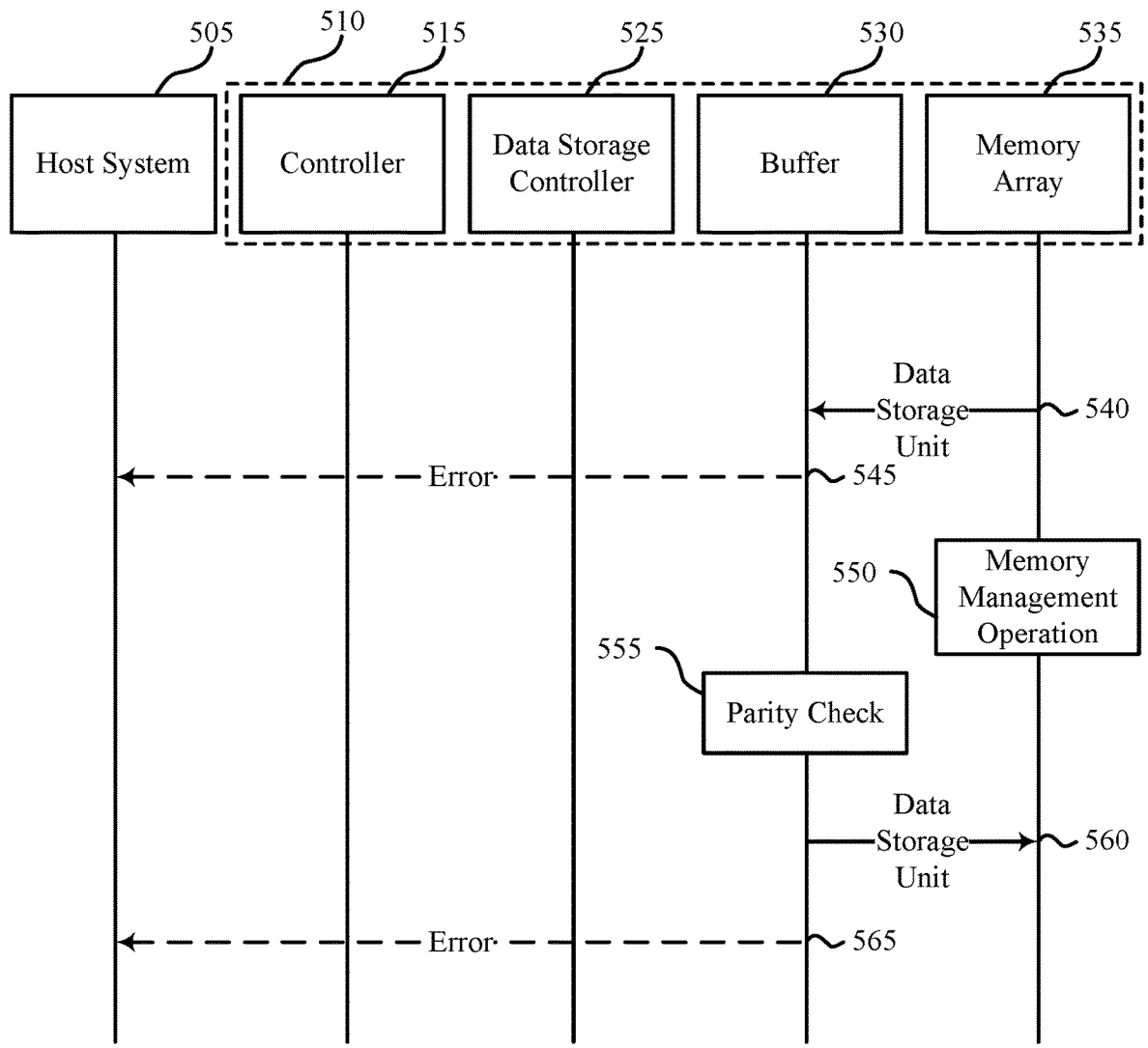
FIG. 5 illustrates an examples of a process flow that supports error notification using an external channel in accordance with examples as disclosed herein.

FIG. 5 illustrates an example of a process flow 500 that supports error notification using an external channel in accordance with examples as disclosed herein. In some examples, the process flow 500 may illustrate a memory management operation, such as a garbage collection operation, performed at a memory system 510. The memory system 510 may be coupled with a host system 505 and may include a controller 515, a data storage controller 525, a buffer 530, and a memory array 535. In some examples, the data storage controller 525, the buffer 530, and the memory array 535 may be examples of the DTM 330, the buffer 335, and the memory array 345 as described with reference to FIG. 3. In some examples, the controller 515 may include an interface controller, a link controller, a protocol controller, or any combination thereof, as described with reference to FIG. 3. The memory system 510 may include other components, such as the components described with reference to FIG. 3, that are not shown. The process flow 500 may illustrate the processing of data storage units during a memory management operation, which may allow for asynchronous transmission of an indication of detected errors in data paths of the memory system 510 (e.g., transmissions not associated with or in response to a command from the host system 505), which may improve the reliability and performance of the host system 505 and the memory system 510.

At 540, the controller 515 may instruct an encoder/decoder (e.g., the encoder/decoder 340 as described with reference to FIG. 3) to retrieve a data storage unit associated with the memory management operation from the memory array 535. The encoder/decoder may decode the data storage unit and transmit the data unit to the buffer 530. In some examples, the data storage unit may include data, a first set of parity bits associated with the data (e.g., end-to-end CRC parity bits configured to protect the entire payload of the data storage unit) and a second set of parity bits associated with the data, such as a set of parity bits generated using the second error control scheme (e.g., the LDPC bits, configured to protect a portion of the payload of the data storage unit). In some cases, the buffer 530 or the encoder/decoder may perform a parity check. For example, the data storage unit or data words of the data storage unit may be transmitted over a communication channel including at least one parity bit used for bus parity (e.g., bus parity between the buffer 530 and the encoder/decoder). If the encoder/decoder or the buffer 530 detects an error, an indication of the error may be transmitted at 545 over an out of band channel to the host system 405.

At 545, the memory system 510 may perform a memory management operation on data associated with the data unit stored in the buffer 530. For example, the memory system 510 may perform a garbage collection operation to manage one or more blocks of memory cells of the memory array 535 used to store the data associate with the data storage unit. In some cases, at 555, the buffer 530 or the encoder/decoder may perform a parity check. For example, the buffer 530 may perform a parity check using the second set of parity bits associated with the data (e.g., the LDPC bits). If the encoder/decoder or the buffer 530 detects an error, an indication of the error may be transmitted at 560 over an out of band channel to the host system 505.

Upon the memory system 510 completing the memory management operation, the encoder/decoder may, at 560, generate one or more data words using the data storage unit, and transmit the one or more codewords associated with the data storage unit to the memory array 535. In some cases, the granularity of a portion of the payload of the data storage unit protected by the fifth set of parity bits may be different than the granularity of the portion of the payload of the data storage unit protected by the fourth set of parity bits. In some cases, the encoder/decoder may generate a set of parity bits for encoded data words using the second error control scheme (e.g., a LDCP scheme) and transmit the data words associated with the data storage unit, including the fifth set of parity bits, to the memory array 535. Accordingly, the encoded data and the third set of parity bits may be written to a portion of the memory array 535. In some examples, the data words associated with the data storage unit may be transmitted over a communication channel including at least one parity bit used for bus parity (e.g., bus parity between the buffer 530 and the encoder/decoder). If the encoder/decoder or the buffer 530 detects an error, an indication of the error may be transmitted at 565 over an out of band channel to the host system 505.

Figure 6:
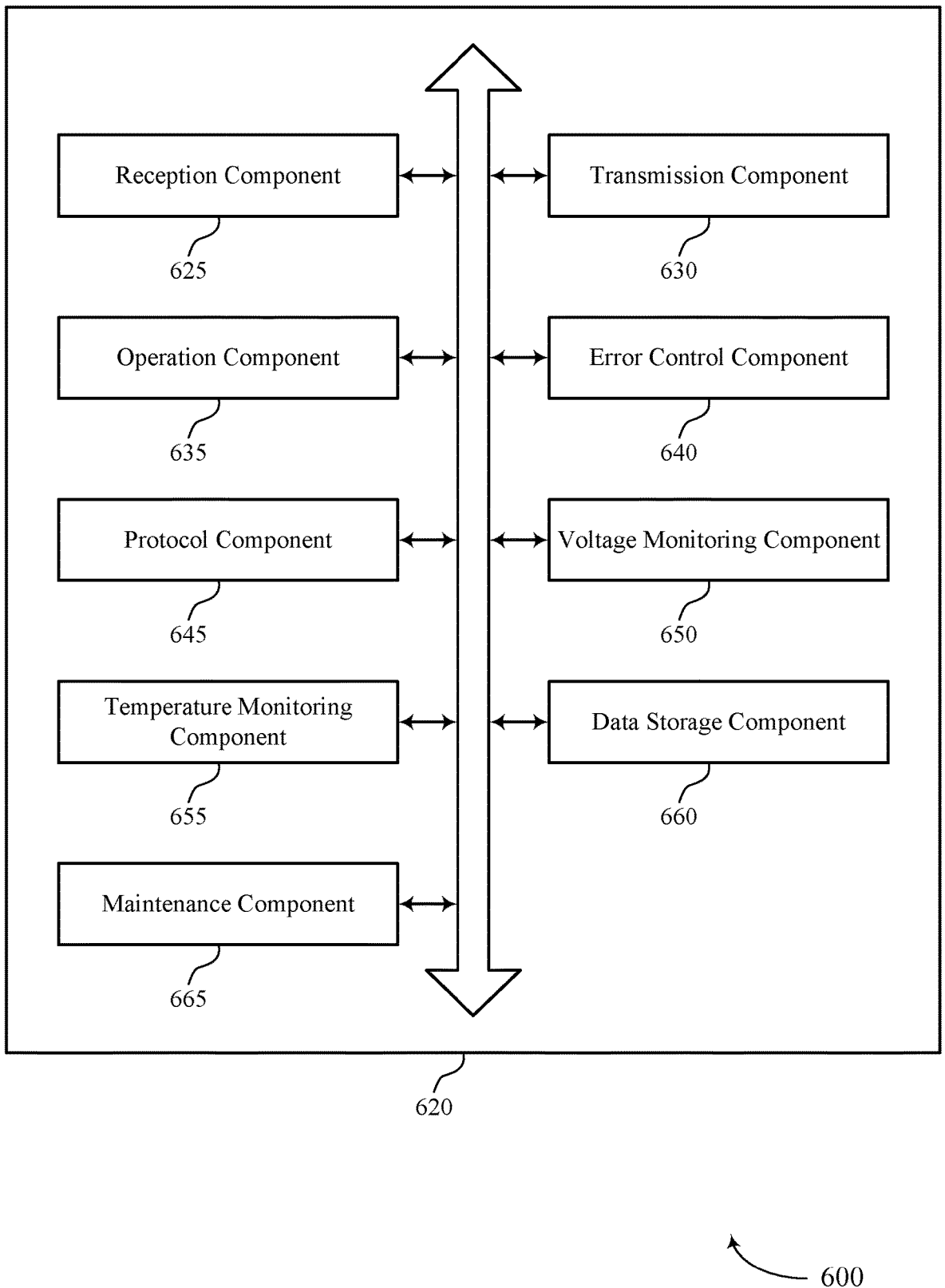
FIG. 6 shows a block diagram of a managed memory system that supports error notification using an external channel in accordance with examples as disclosed herein.

FIG. 6 shows a block diagram 600 of a managed memory system 620 that supports error notification using an external channel in accordance with examples as disclosed herein. The managed memory system 620 may be an example of aspects of a managed memory system as described with reference to FIGS. 1 through 4B. The managed memory system 620, or various components thereof, may be an example of means for performing various aspects of error notification using an external channel as described herein. For example, the managed memory system 620 may include a reception component 625, a transmission component 630, an operation component 635, an error control component 640, a protocol component 645, a voltage monitoring component 650, a temperature monitoring component 655, a data storage component 660, a maintenance component 665, or any combination thereof. Each of these components may communicate, directly or indirectly, with one another (e.g., via one or more buses).

The reception component 625 may be configured as or otherwise support a means for receiving, at an interface controller of a memory system, a write command including first data and first parity information associated with the first data, where the interface controller includes a host-driven logical block interface. The transmission component 630 may be configured as or otherwise support a means for acknowledging, via the host-driven logical block interface in response to receiving the write command, that the first data has been received based on determining that the first parity information matches second parity information generated from the first data. The operation component 635 may be configured as or otherwise support a means for performing one or more operations on second data and third parity information associated with the second data, where the second data includes the first data. The error control component 640 may be configured as or otherwise support a means for identifying an error associated with performing the one or more operations on the second data after acknowledging that the first data has been received. In some examples, the transmission component 630 may be configured as or otherwise support a means for transmitting an indication of the error over a channel that is external to the host-driven logical block interface.

In some examples, the protocol component 645 may be configured as or otherwise support a means for generating, by the interface controller, a protocol unit based on acknowledging that the first data has been received, where the protocol unit includes the second data and the third parity information associated with the second data, and where performing the one or more operations is based on generating the protocol unit.

In some examples, to support performing the one or more operations, the reception component 625 may be configured as or otherwise support a means for receiving, by a data storage controller of the memory system, the protocol unit. In some examples, to support performing the one or more operations, the error control component 640 may be configured as or otherwise support a means for generating, by the data storage controller, fourth parity information associated with the second data based on receiving the protocol unit. In some examples, to support performing the one or more operations, the error control component 640 may be configured as or otherwise support a means for comparing the third parity information with the fourth parity information based on generating the fourth parity information. In some examples, to support performing the one or more operations, the error control component 640 may be configured as or otherwise support a means for issuing, to the interface controller, a second indication that the fourth parity information does not match the third parity information, where transmitting the indication of the error is based on issuing the second indication.

In some examples, to support performing the one or more operations, the reception component 625 may be configured as or otherwise support a means for receiving, by a data storage controller of the memory system, the protocol unit. In some examples, to support performing the one or more operations, the error control component 640 may be configured as or otherwise support a means for generating, by the data storage controller, fourth parity information associated with the second data based on receiving the protocol unit. In some examples, to support performing the one or more operations, the error control component 640 may be configured as or otherwise support a means for comparing the third parity information with the fourth parity information based on generating the fourth parity information. In some examples, to support performing the one or more operations, the data storage component 660 may be configured as or otherwise support a means for storing the second data of the protocol unit and the fourth parity information in a memory array of the memory system.

In some examples, to support performing the one or more operations, the maintenance component 665 may be configured as or otherwise support a means for performing one or more maintenance operations on the memory array based on storing the second data in the memory array. In some examples, to support performing the one or more operations, the error control component 640 may be configured as or otherwise support a means for generating fifth parity information associated with the second data as part of performing the one or more maintenance operations. In some examples, to support performing the one or more operations, the error control component 640 may be configured as or otherwise support a means for comparing the fifth parity information with the fourth parity information based on generating the fourth parity information. In some examples, to support performing the one or more operations, the error control component 640 may be configured as or otherwise support a means for issuing to the interface controller, a second indication that the fifth parity information does not match the fourth parity information, where transmitting the indication of the error is based on issuing the second indication.

In some examples, the protocol unit includes a Universal Flash Storage Protocol Information Unit (UPIU).

In some examples, to support performing the one or more operations, the voltage monitoring component 650 may be configured as or otherwise support a means for performing an operation to determine one or more supply voltages. In some examples, to support performing the one or more operations, the voltage monitoring component 650 may be configured as or otherwise support a means for determining whether a supply voltage of the one or more supply voltages is within a voltage range, where transmitting the indication of the error is based on determining that the supply voltage is not within the voltage range.

In some examples, to support performing the one or more operations, the temperature monitoring component 655 may be configured as or otherwise support a means for performing an operation to determine a temperature of the memory system. In some examples, to support performing the one or more operations, the temperature monitoring component 655 may be configured as or otherwise support a means for determining whether the temperature is within a temperature range, where transmitting the indication of the error is based on determining that the temperature is not within the temperature range.

In some examples, the channel includes a general purpose input/output (GPIO) channel.

In some examples, the host-driven logical block interface includes a universal flash storage (UFS) interface.

In some examples, the interface controller receives the write command via a physical interface including one or more serial data lanes.

In some examples, the interface controller is configured to communicate over the host-driven logical block interface in response to receiving one or more commands over the host-driven logical block interface.

Figure 7:
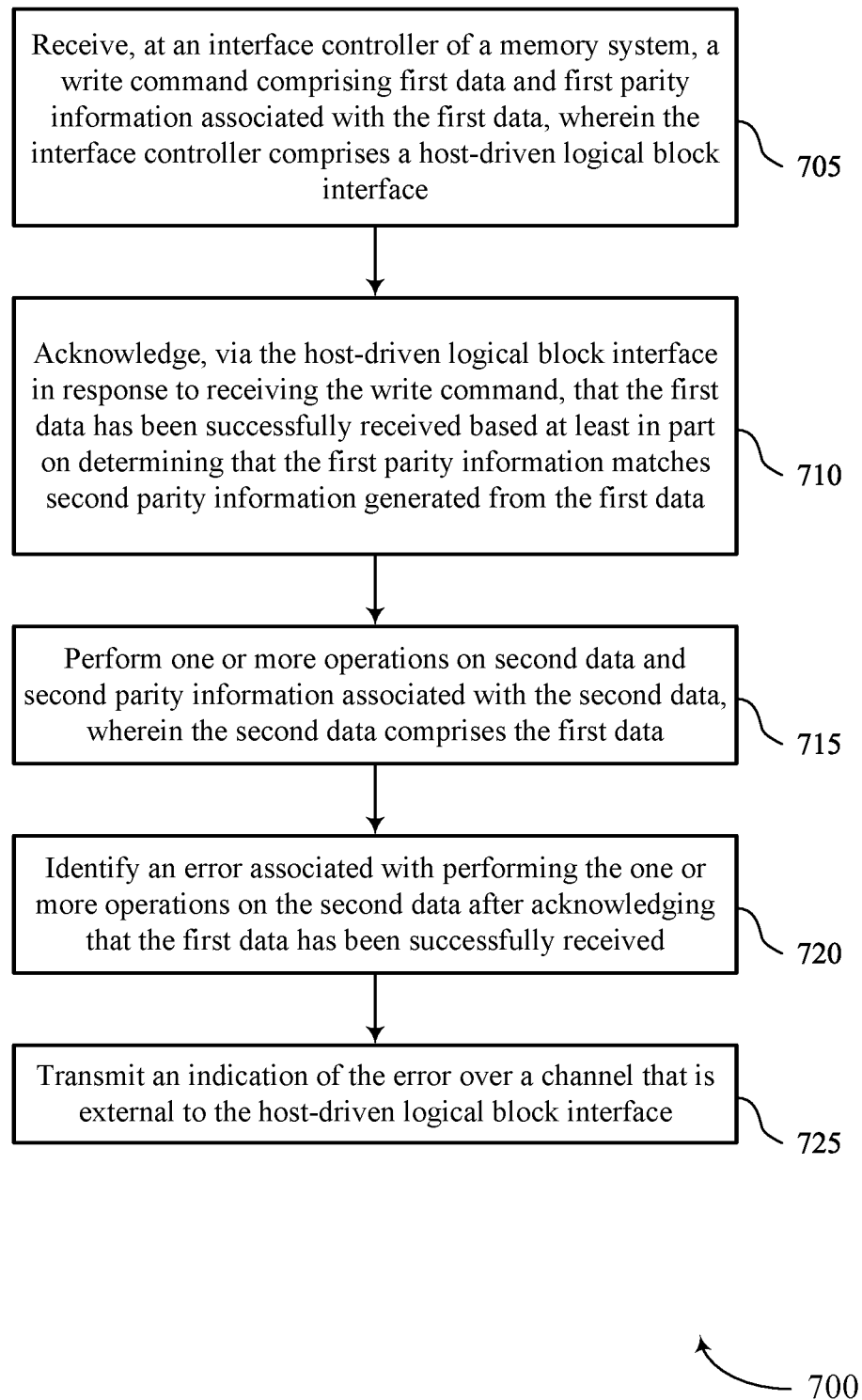
FIG. 7 shows a flowchart illustrating a method or methods that support error notification using an external channel in accordance with examples as disclosed herein.

FIG. 7 shows a flowchart illustrating a method 700 that supports error notification using an external channel in accordance with examples as disclosed herein. The operations of method 700 may be implemented by a managed memory system or its components as described herein. For example, the operations of method 700 may be performed by a managed memory system as described with reference to FIGS. 1 through 6. In some examples, a managed memory system may execute a set of instructions to control the functional elements of the device to perform the described functions. Additionally, or alternatively, the managed memory system may perform aspects of the described functions using special-purpose hardware.

At 705, the method may include receiving, at an interface controller of a memory system, a write command including first data and first parity information associated with the first data, where the interface controller includes a host-driven logical block interface. The operations of 705 may be performed in accordance with examples as disclosed herein. In some examples, aspects of the operations of 705 may be performed by a reception component 625 as described with reference to FIG. 6.

At 710, the method may include acknowledging, via the host-driven logical block interface in response to receiving the write command, that the first data has been received based on determining that the first parity information matches second parity information generated from the first data. The operations of 710 may be performed in accordance with examples as disclosed herein. In some examples, aspects of the operations of 710 may be performed by a transmission component 630 as described with reference to FIG. 6.

At 715, the method may include performing one or more operations on second data and third parity information associated with the second data, where the second data includes the first data. The operations of 715 may be performed in accordance with examples as disclosed herein. In some examples, aspects of the operations of 715 may be performed by an operation component 635 as described with reference to FIG. 6.

At 720, the method may include identifying an error associated with performing the one or more operations on the second data after acknowledging that the first data has been received. The operations of 720 may be performed in accordance with examples as disclosed herein. In some examples, aspects of the operations of 720 may be performed by an error control component 640 as described with reference to FIG. 6.

At 725, the method may include transmitting an indication of the error over a channel that is external to the host-driven logical block interface. The operations of 725 may be performed in accordance with examples as disclosed herein. In some examples, aspects of the operations of 725 may be performed by a transmission component 630 as described with reference to FIG. 6.

In some examples, an apparatus as described herein may perform a method or methods, such as the method 700. The apparatus may include features, circuitry, logic, means, or instructions (e.g., a non-transitory computer-readable medium storing instructions executable by a processor), or any combination thereof for performing the following aspects of the present disclosure:

Aspect 1: A method, apparatus, or non-transitory computer-readable medium including operations, features, circuitry, logic, means, or instructions, or any combination thereof for receiving, at an interface controller of a memory system, a write command including first data and first parity information associated with the first data, where the interface controller includes a host-driven logical block interface; acknowledging, via the host-driven logical block interface in response to receiving the write command, that the first data has been received based on determining that the first parity information matches second parity information generated from the first data; performing one or more operations on second data and third parity information associated with the second data, where the second data includes the first data; identifying an error associated with performing the one or more operations on the second data after acknowledging that the first data has been received; and transmitting an indication of the error over a channel that is external to the host-driven logical block interface.

Aspect 2: The method, apparatus, or non-transitory computer-readable medium of aspect 1, further including operations, features, circuitry, logic, means, or instructions, or any combination thereof for generating, by the interface controller, a protocol unit based on acknowledging that the first data has been received, where the protocol unit includes the second data and the third parity information associated with the second data, and where performing the one or more operations is based on generating the protocol unit.

Aspect 3: The method, apparatus, or non-transitory computer-readable medium of aspect 2 where performing the one or more operations includes operations, features, circuitry, logic, means, or instructions, or any combination thereof for receiving, by a data storage controller of the memory system, the protocol unit; generating, by the data storage controller, fourth parity information associated with the second data based on receiving the protocol unit; comparing the third parity information with the fourth parity information based on generating the fourth parity information; and issuing, to the interface controller, a second indication that the fourth parity information does not match the third parity information, where transmitting the indication of the error is based on issuing the second indication.

Aspect 4: The method, apparatus, or non-transitory computer-readable medium of any of aspects 2 through 3 where performing the one or more operations includes operations, features, circuitry, logic, means, or instructions, or any combination thereof for receiving, by a data storage controller of the memory system, the protocol unit; generating, by the data storage controller, fourth parity information associated with the second data based on receiving the protocol unit; comparing the third parity information with the fourth parity information based on generating the fourth parity information; and storing the second data of the protocol unit and the fourth parity information in a memory array of the memory system.

Aspect 5: The method, apparatus, or non-transitory computer-readable medium of aspect 4 where performing the one or more operations includes operations, features, circuitry, logic, means, or instructions, or any combination thereof for performing one or more maintenance operations on the memory array based on storing the second data in the memory array; generating fifth parity information associated with the second data as part of performing the one or more maintenance operations; comparing the fifth parity information with the fourth parity information based on generating the fourth parity information; and issuing to the interface controller, a second indication that the fifth parity information does not match the fourth parity information, where transmitting the indication of the error is based on issuing the second indication.

Aspect 6: The method, apparatus, or non-transitory computer-readable medium of any of aspects 2 through 5 where the protocol unit includes a Universal Flash Storage Protocol Information Unit (UPIU).

Aspect 7: The method, apparatus, or non-transitory computer-readable medium of any of aspects 1 through 6 where performing the one or more operations includes operations, features, circuitry, logic, means, or instructions, or any combination thereof for performing an operation to determine one or more supply voltages and determining whether a supply voltage of the one or more supply voltages is within a voltage range, where transmitting the indication of the error is based on determining that the supply voltage is not within the voltage range.

Aspect 8: The method, apparatus, or non-transitory computer-readable medium of any of aspects 1 through 7 where performing the one or more operations includes operations, features, circuitry, logic, means, or instructions, or any combination thereof for performing an operation to determine a temperature of the memory system and determining whether the temperature is within a temperature range, where transmitting the indication of the error is based on determining that the temperature is not within the temperature range.

Aspect 9: The method, apparatus, or non-transitory computer-readable medium of any of aspects 1 through 8 where the channel includes a general purpose input/output (GPIO) channel.

Aspect 10: The method, apparatus, or non-transitory computer-readable medium of any of aspects 1 through 9 where the host-driven logical block interface includes a universal flash storage (UFS) interface.

Aspect 11: The method, apparatus, or non-transitory computer-readable medium of any of aspects 1 through 10 where the interface controller receives the write command via a physical interface including one or more serial data lanes.

Aspect 12: The method, apparatus, or non-transitory computer-readable medium of any of aspects 1 through 11 where the interface controller is configured to communicate over the host-driven logical block interface in response to receiving one or more commands over the host-driven logical block interface.

It should be noted that the described techniques include possible implementations, and that the operations and the steps may be rearranged or otherwise modified and that other implementations are possible. Further, portions from two or more of the methods may be combined.

Information and signals described herein may be represented using any of a variety of different technologies and techniques. For example, data, instructions, commands, information, signals, bits, symbols, and chips that may be referenced throughout the description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to a condition of moving from an open-circuit relationship between components in which signals are not presently capable of being communicated between the components over a conductive path to a closed-circuit relationship between components in which signals are capable of being communicated between components over the conductive path. If a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other if the switch is open. If a controller isolates two components, the controller affects a change that prevents signals from flowing between the components using a conductive path that previously permitted signals to flow.

The terms "if," "when," "based on," or "based at least in part on" may be used interchangeably. In some examples, if the terms "if," "when," "based on," or "based at least in part on" are used to describe a conditional action, a conditional process, or connection between portions of a process, the terms may be interchangeable.

The term "in response to" may refer to one condition or action occurring at least partially, if not fully, as a result of a previous condition or action. For example, a first condition or action may be performed and second condition or action may at least partially occur as a result of the previous condition or action occurring (whether directly after or after one or more other intermediate conditions or actions occurring after the first condition or action).

Additionally, the terms "directly in response to" or "in direct response to" may refer to one condition or action occurring as a direct result of a previous condition or action. In some examples, a first condition or action may be performed and second condition or action may occur directly as a result of the previous condition or action occurring independent of whether other conditions or actions occur. In some examples, a first condition or action may be performed and second condition or action may occur directly as a result of the previous condition or action occurring, such that no other intermediate conditions or actions occur between the earlier condition or action and the second condition or action or a limited quantity of one or more intermediate steps or actions occur between the earlier condition or action and the second condition or action. Any condition or action described herein as being performed "based on," "based at least in part on," or "in response to" some other step, action, event, or condition may additionally or alternatively (e.g., in an alternative example) be performed "in direct response to" or "directly in response to" such other condition or action unless otherwise specified.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In some other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as an n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" if a voltage greater than or equal to the transistor's threshold voltage is applied to the transistor gate. The transistor may be "off" or "deactivated" if a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration" and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a hyphen and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over, as one or more instructions or code, a computer-readable medium. Other examples and implementations are within the scope of the disclosure and appended claims. For example, due to the nature of software, the described functions can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and components described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include CD, laser disc, optical disc, digital versatile disc (DVD), floppy disk, and Blu-ray disc, where disks usually reproduce data magnetically, while discs reproduce data optically with lasers. Combinations of these are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. An apparatus, comprising:
an interface controller configured to cause the apparatus to:
receive, via a host-driven logical block interface, a write command comprising first data and first parity information associated with the first data; and
acknowledge, via the host-driven logical block interface in response to receiving the write command, that the first data has been received based on determining that the first parity information matches second parity information generated from the first data; and
a memory controller configured to cause the apparatus to:
perform one or more operations on second data and third parity information associated with the second data, wherein the second data comprises the first data;
identify an error associated with performing the one or more operations on the second data after acknowledging that the first data has been received; and
transmit an indication of the error over a channel external to the host-driven logical block interface.

2. The apparatus of claim 1, wherein the interface controller is further configured to:
generate a protocol unit based on receiving the write command, wherein the protocol unit comprises the second data and the third parity information associated with the second data, and wherein performing the one or more operations is based on generating the protocol unit.

3. The apparatus of claim 2, wherein the memory controller comprises a data storage controller, and wherein, to perform the one or more operations, the data storage controller is configured to cause the apparatus to:
receive the protocol unit;
generate fourth parity information associated with the second data based on receiving the protocol unit;
compare the third parity information with the fourth parity information based on generating the fourth parity information; and
issue, to the interface controller, a second indication that the fourth parity information does not match the third parity information, wherein transmitting the indication of the error is based on issuing the second indication.

4. The apparatus of claim 2, wherein the memory controller comprises a data storage controller, and wherein, to perform the one or more operations, the data storage controller is configured to cause the apparatus to:
receive the protocol unit;
generate, by the data storage controller, fourth parity information associated with the second data based on receiving the protocol unit;
compare the third parity information with the fourth parity information based on generating the fourth parity information; and
store the second data of the protocol unit and the fourth parity information in a memory array.

5. The apparatus of claim 4, wherein, to perform the one or more operations, the memory controller is further configured to cause the apparatus to:
perform one or more maintenance operations on the memory array based on storing the second data in the memory array;
generate fifth parity information associated with the second data as part of performing the one or more maintenance operations;
compare the fifth parity information with the fourth parity information based on generating the fourth parity information; and issue, to the interface controller, a second indication that the fifth parity information does not match the fourth parity information, wherein transmitting the indication of the error is based on issuing the second indication.

6. The apparatus of claim 2, wherein the protocol unit comprises a Universal Flash Storage Protocol Information Unit (UPIU).

7. The apparatus of claim 1, wherein, to perform the one or more operations, the memory controller is configured to cause the apparatus to:
perform an operation to determine one or more supply voltages; and
determine whether a supply voltage of the one or more supply voltages is within a voltage range, wherein transmitting the indication of the error is based on determining that the supply voltage is not within the voltage range.

8. The apparatus of claim 1, wherein, to perform the one or more operations, the memory controller is configured to cause the apparatus to:
perform an operation to determine a temperature; and
determine whether the temperature is within a temperature range, wherein transmitting the indication of the error is based on determining that the temperature is not within the temperature range.

9. The apparatus of claim 1, wherein the channel comprises a general purpose input/output (GPIO) channel.

10. The apparatus of claim 1, wherein the host-driven logical block interface comprises a universal flash storage (UFS) interface.

11. The apparatus of claim 1, wherein the interface controller receives the write command via a physical interface comprising one or more serial data lanes.

12. The apparatus of claim 1, wherein:
the interface controller is configured to communicate over the host-driven logical block interface in response to receiving one or more commands over the host-driven logical block interface.

13. A non-transitory computer-readable medium storing code, the code comprising instructions executable by a processor to:
receive, at an interface controller of a memory system, a write command comprising first data and first parity information associated with the first data, wherein the interface controller comprises a host-driven logical block interface;
acknowledge, via the host-driven logical block interface in response to receiving the write command, that the first data has been received based on determining that the first parity information matches second parity information generated from the first data;
perform one or more operations on second data and third parity information associated with the second data, wherein the second data comprises the first data;
identify an error associated with performing the one or more operations on the second data after acknowledging that the first data has been received; and
transmit an indication of the error over a channel that is external to the host-driven logical block interface.

14. The non-transitory computer-readable medium of claim 13, wherein the instructions are further executable by the processor to:
generate, by the interface controller, a protocol unit based on receiving the write command, wherein the protocol unit comprises the second data and the third parity information associated with the second data, and wherein performing the one or more operations is based on generating the protocol unit.

15. The non-transitory computer-readable medium of claim 14, wherein the instructions to perform the one or more operations are executable by the processor to:
receive, by a data storage controller of the memory system, the protocol unit;
generate, by the data storage controller, fourth parity information associated with the second data based on receiving the protocol unit;
compare the third parity information with the fourth parity information based on generating the fourth parity information; and
issue, to the interface controller, a second indication that the fourth parity information does not match the third parity information, wherein transmitting the indication of the error is based on issuing the second indication.

16. The non-transitory computer-readable medium of claim 14, wherein the instructions to perform the one or more operations are executable by the processor to:
receive, by a data storage controller of the memory system, the protocol unit;
generate, by the data storage controller, fourth parity information associated with the second data based on receiving the protocol unit;
compare the third parity information with the fourth parity information based on generating the fourth parity information; and
store the second data of the protocol unit and the fourth parity information in a memory array of the memory system.

17. The non-transitory computer-readable medium of claim 16, wherein the instructions to perform the one or more operations are further executable by the processor to:
perform one or more maintenance operations on the memory array based on storing the second data in the memory array;
generate fifth parity information associated with the second data as part of performing the one or more maintenance operations;
compare the fifth parity information with the fourth parity information based on generating the fourth parity information; and
issue, to the interface controller, a second indication that the fifth parity information does not match the fourth parity information, wherein transmitting the indication of the error is based on issuing the second indication.

18. The non-transitory computer-readable medium of claim 14, wherein the protocol unit comprises a Universal Flash Storage Protocol Information Unit (UPIU).

19. The non-transitory computer-readable medium of claim 13, wherein the instructions to perform the one or more operations are executable by the processor to:
perform an operation to determine one or more supply voltages; and
determine whether a supply voltage of the one or more supply voltages is within a voltage range, wherein transmitting the indication of the error is based on determining that the supply voltage is not within the voltage range.

20. The non-transitory computer-readable medium of claim 13, wherein the instructions to perform the one or more operations are executable by the processor to:
perform an operation to determine a temperature of the memory system; and
determine whether the temperature is within a temperature range, wherein transmitting the indication of the error is based on determining that the temperature is not within the temperature range.

21. The non-transitory computer-readable medium of claim 13, wherein the channel comprises a general purpose input/output (GPIO) channel.

22. The non-transitory computer-readable medium of claim 13, wherein the host-driven logical block interface comprises a universal flash storage (UFS) interface.

23. A method, comprising: receiving, at an interface controller of a memory system, a write command comprising first data and first parity information associated with the first data, wherein the interface controller comprises a host-driven logical block interface; acknowledging, via the host-driven logical block interface in response to receiving the write command, that the first data has been received based on determining that the first parity information matches second parity information generated from the first data; performing one or more operations on second data and third parity information associated with the second data, wherein the second data comprises the first data; identifying an error associated with performing the one or more operations on the second data after acknowledging that the first data has been received; and transmitting an indication of the error over a channel that is external to the host-driven logical block interface.

24. The method of claim 23, further comprising:

generating, by the interface controller, a protocol unit based on receiving the write command, wherein the protocol unit comprises the second data and the second parity information associated with the second data, and wherein performing the one or more operations is based on generating the protocol unit.

25. The method of claim 24, wherein performing the one or more operations comprises:

receiving, by a data storage controller of the memory system, the protocol unit;

generating, by the data storage controller, third parity information associated with the second data based on receiving the protocol unit;

comparing the second parity information with the third parity information based on generating the third parity information; and issuing, to the interface controller, a second indication that the third parity information does not match the second parity information, wherein transmitting the indication of the error is based on issuing the second indication.

* * * * *